United States Patent [19]
Parson

[11] Patent Number: 6,053,947
[45] Date of Patent: Apr. 25, 2000

[54] SIMULATION MODEL USING OBJECT-ORIENTED PROGRAMMING

[75] Inventor: Dale E. Parson, Fleetwood, Pa.

[73] Assignee: Lucent Technologies, Inc., Murray Hill, N.J.

[21] Appl. No.: 08/866,937

[22] Filed: May 31, 1997

[51] Int. Cl.[7] .................................................. G06F 17/50
[52] U.S. Cl. .............................. 703/14; 703/13; 703/15; 703/16
[58] Field of Search .................. 395/500.35, 500.02, 395/500.37, 500.34, 500.36

[56] References Cited

U.S. PATENT DOCUMENTS

| | | | |
|---|---|---|---|
| 5,301,318 | 4/1994 | Mittal ................................. | 395/500.02 |
| 5,493,507 | 2/1996 | Shinde et al. ...................... | 395/500.35 |
| 5,694,579 | 12/1997 | Rasdan et al. ..................... | 395/500.35 |
| 5,870,585 | 2/1999 | Stapleton ........................... | 395/500.36 |

OTHER PUBLICATIONS

Ganguly, N.; Pitchumani, V.;"HSIM1 and HSIM2: Object Oriented Algorithms for VHDL Simulation", Proceedings of the Seventh International Conference on VLSI Design, pp. 175–178, Jan. 8, 1994.

Kosbar, K; Schneider, K.; "Object–Oriented Modeling of Communications Systems", Conference Record IEEE Military Communications Conference (MILCOM '92), vol. 1, pp 68–72., Oct. 1992.

Tymerski, R; Li D.; Wang, X.;"Object Oriented Design of Power Electronic Circuit Simulator", IEEE Workshop on Computers in Power Electronics, pp. 101–108., Aug. 1992.

York, G.; Mueller–Thuns, R.; Patel, J.; Beatty, D.; "An Integrated Environment for HDL Verification", IEEE Interanational Verilog HDL Conference, pp. 9–18, Mar. 1995.

Davis, A., "An Object–Oriented Approach to Circuit Simulation", IEEE 39th Midwest Symposium on Circuits and Systems, 1996, vol. 1, pp. 313–316, Aug. 1996.

Maurer, P.M., "Efficient Simulation for Hierarchical and Partitioned Circuits", Proceedings of the Twelfth Conference on VLSI Design, 1999, pp. 236–241, Jan. 1999.

*Primary Examiner*—Kevin J. Teska
*Assistant Examiner*—Doug Sergent
*Attorney, Agent, or Firm*—Synnestvedt & Lechner LLP

[57] ABSTRACT

A method, apparatus and system for simulating the operation of a circuit using a computer-based simulator comprising: (a) distributing at least one signal upon to one or more simulation model subcircuit functions, which use the signal, upon a change in the signal; (b) scheduling one or more subcircuit functions that use the signal for execution according to a priority assigned to each subcircuit function; and (c) providing an output value to the simulator when no subcircuit functions are scheduled, otherwise, executing one or more subcircuit functions with the highest priority and returning to step (a) to repeat the process.

24 Claims, 8 Drawing Sheets

SIMULATION MODEL USING OBJECT-ORIENTED PROGRAMMING

BACKGROUND OF THE INVENTION

1. Field of the Invention

The present invention relates generally to a computer-based simulation model for simulating the operation of an electrical circuit. More specifically, the invention relates to a method, apparatus, and system of employing an object-oriented programming convention for simulating hierarchical circuits.

2. Background of the Invention

During the manufacture and testing of electrical circuits, simulators are often constructed to simulate the operation or behavior of such circuits. These circuit simulations are used to detect flaws in a circuit's design and to check a component's interaction with other components in a larger circuit.

The term "simulator" as used herein broadly refers to a software program that simulates actions of electronic circuits by exercising interconnected simulation models. The term "simulation model" broadly refers to a software representation of a circuit component. It also should be noted that the term "circuit" as used herein broadly refers to a combination of electrical components that cooperate to perform a particular function. The type of circuit that may be simulated according to the present invention ranges from a simple on/off switch to a complex super computer.

Traditionally, circuits have been described using netlist languages which are well known in the art. A netlist language is characterized by a number of constructs. First, a netlist language defines input and output ports of a subcircuit. A port is a connection to a subcircuit. Second, a netlist language represents connections between ports. Third, it can represent a nested subcircuit within a circuit. And fourth, a netlist language has some measure of extension capability for tagging properties to ports, connections, and/or subcircuits.

Conventional netlist model languages used for simulating hierarchical circuits include, for example, EDIF netlist view (*EDIF, Electronic Design Interchange Format*, Standard 2.0, Electronic Industries Association, Washington, D.C., December, 1993); structural VHDL (*IEEE Standard VHDL Language Reference Manual*, Std 1076–1993, IEEE, New York, 1993); and VERILOG (*IEEE Standard* 1364–1995).

Although these model languages are suitable usually for traditional simulation applications, such as detecting faults in circuit designs, they tend to be inadequate for newer applications, such as debugging application code running on a simulated processor. Netlist language simulation models tend to be monolithic. A circuit modeler is limited to data formats and run-time signal propagation strategies hard coded into the simulation engines. Consequently, in non-traditional application, hand coding usually is required.

Hand coding is problematic for a variety of reasons. Among the more significant shortcomings is the high cost and time it requires. Rather than turning to a convenient library of precoded simulation modules, a modeler must examine a particular component to be simulated, and then develop a programming approach on an ad hoc basis. Such an investment of time tends to discourage the development of unique and highly specialized models.

Hand coding not only is time consuming and expensive, but also results in a lack of standardization which has several detrimental effects. For example, it results in disparate programming techniques and approaches. This necessarily means that some components will be more skillfully modeled than other components. Since all the simulation models must cooperate, however, one substandard model can compromise the entire simulation model.

Aside from a lack of standardization, the disparate programming techniques render simulation analysis or modification difficult. For example, to analyze a potential problem in the circuit, the modeler must first become acquainted with the modeling approach taken to simulate the behavior of a particular component. When models simulate circuit behavior in different ways, it also is difficult to determine readily where a problem lies. In other words, there is no systematic approach to debugging; there is no standardized "tap" to plug into to determine the step-wise propagation of a signal.

Therefore, a need exists for a simulation model that not only provides the familiarity of conventional netlist languages, but also runs efficiently without incurring the traditional netlist overhead and offers flexibility with extension capability. The present invention fulfills this need among others.

SUMMARY OF THE PRESENT INVENTION

The present invention provides for a computer-based simulation model that offers flexibility and efficiency in simulating a circuit while maintaining the same basic structure and notation as netlist languages. More specifically, the simulation model employs a unique, object-oriented programming convention. The programming convention used to express circuit design is similar in appearance and usage to hierarchical netlist languages, such as VHDL, but the convention's object-oriented environment gives the circuit modeler considerably more flexibility in customizing features and increasing execution speed than is possible under commercially available simulation environments.

One aspect of the invention is a method for simulating the operation of a circuit using a computer-based simulator. The process basically comprises (a) a constructing a simulation model using an object-oriented programming convention; and (b) simulating the circuit using the constructed simulation model. In the construction phase, object constructors are used to emulate a netlist language, and object-oriented aggregation or containment techniques are used to maintain a circuit's hierarchy. In the simulation phase, signal values are distributed among interconnected models only on value changes, and then, only to those non-hierarchical models that use the changed signal values in their function. Additionally, circuit topology is used to assign optimal execution priorities to sub-circuit models. During simulation model functions are scheduled and executed according to their priority to improve run-time efficiency.

Another aspect of the invention involves an apparatus for performing the above process. In one embodiment, the apparatus comprises (a) a processor; (b) user interface means operatively connected to the processor for receiving input from and conveying output to a user; and c) memory operatively connected to the processor. The memory contains means for instructing the processor to perform the aforementioned process in a simulation of a circuit's operation.

Yet another aspect of the invention comprises a computer readable medium containing instructions for instructing the processor to perform the aforementioned process for simulating a circuit's operation.

BRIEF DESCRIPTION OF THE DRAWINGS

The features of the present invention, which are believed to be novel, are set forth with particularity in the appended claims. The invention may best be understood by reference to the following description taken in conjunction with the accompanying drawings, wherein like reference numerals identify like elements, and wherein:

DETAILED DESCRIPTION

Figure 1:
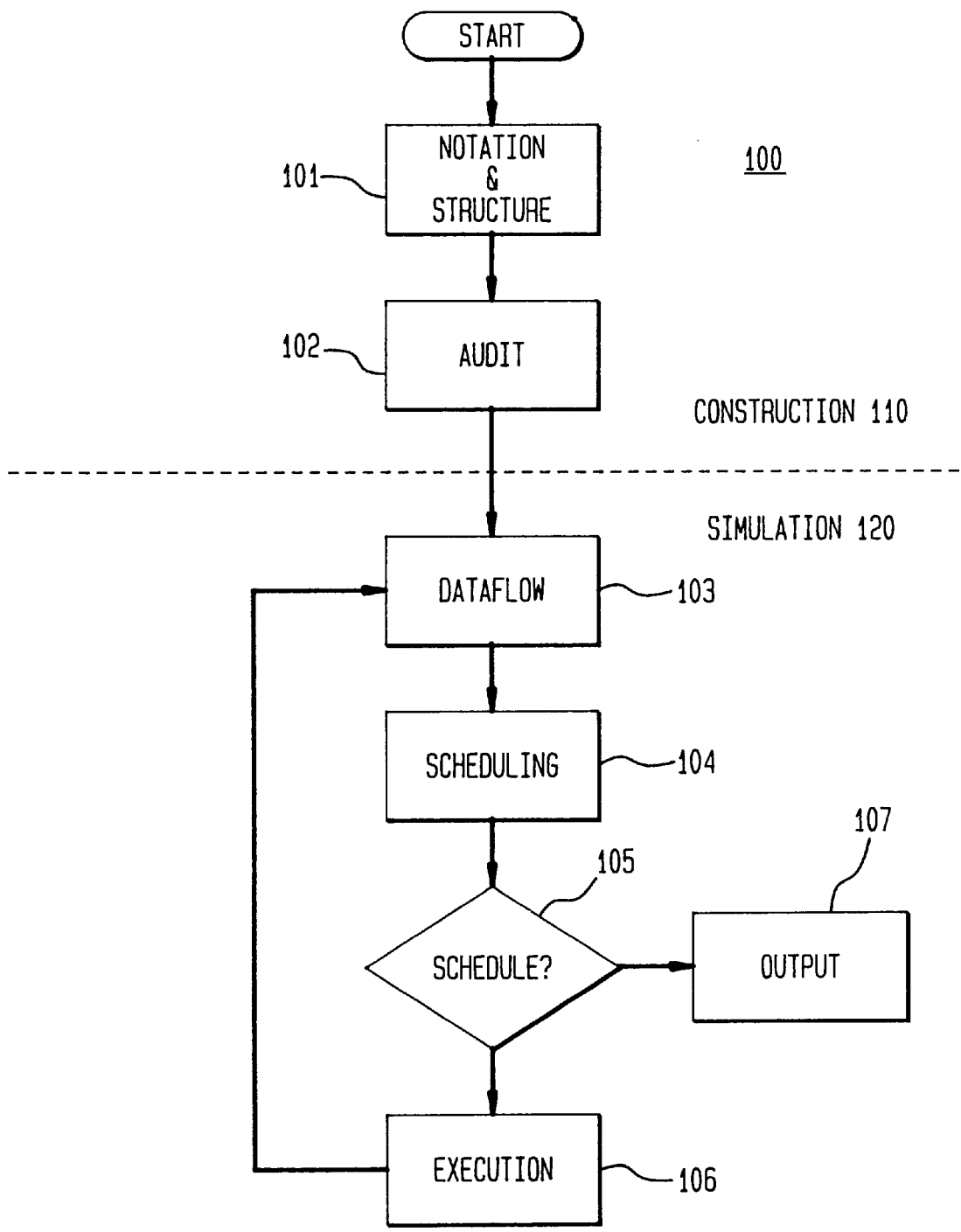
FIG. 1 shows a schematic diagram of a preferred simulation process of the present invention.

The present invention provides for a computer-based simulation model that offers flexibility and efficiency in simulating a circuit while maintaining the same basic structure and notation as netlist languages such as VHDL. More specifically, the invention establishes a programming convention for an object-oriented programming language for constructing a simulation model.

Section I of the Detailed Description describes the present invention in terms of its basic features and simple embodiments. Sections II provides a description of the simulation model's construction phase. More specifically, this section describes a generic class infrastructure of a preferred embodiment and provides a preferred approach in generating the infrastructure from a conventional netlist representation of a circuit. In Section III, the simulation phase of the invention is described. Section IV exemplifies the coding convention in terms of a circuit-specific model. It does so by illustrating one possible VHDL representation of a simple processor compared to a representation using the coding convention of the present invention.

I.

A simulation model constructed according to the coding convention of the present invention has a number of features that distinguish it over prior art simulation models. First, it represents hierarchical circuits using a unique object-oriented programming convention that is structurally equivalent to industry-standard netlist notations used by circuit designers and circuit capture and synthesis tools. This feature is referred to herein as the "notational feature." This feature renders the construction of the simulation model straightforward for circuit designers. Additionally, this feature facilitates automatic generation of circuit simulation models because many existing circuit capture and synthesis tools and methodologies deliver their output in the form of hierarchical netlist. Second, the simulation model represents hierarchical digital circuit design information as contained model objects. Circuit hierarchy is not lost by "flattening" the model during simulation. This feature is referred to herein as the "structural feature." Third, the simulation model uses a data flow convention to distribute signal values among model functions only on value changes, and only to those non-hierarchical models that use the signal values in their function. This feature is referred to herein as the "dataflow feature." Fourth, the simulation model assigns optimal execution priorities to subcircuit model functions, and executes such functions accordingly. This feature is referred to herein as the "scheduling feature." Thus, the data flow feature and the scheduling feature cooperate to provide for the efficient propagation and execution of signals in the simulation model.

The aforementioned features result from the coding convention of the present invention, and, more specifically, from the convention's utilization of the particular programming properties found in a suitable programming language. Among these properties is inheritance, which refers to the ability of a subclass to inherent properties of the class from which it depends. Another property is aggregation or containment, which refers to the ability to group or contain objects in a hierarchy according to function. And finally, the language should have encapsulation which refers to the ability to incorporate implementation details within objects. Suitable object-orientated languages include, for example, C++, Smalltalk, and Java.

According to the present invention, a method, apparatus and system are provided for simulating the operation of a circuit using a computer-based simulator and a simulation model that has a combination of one or more of the aforementioned features.

A preferred process embodiment of the present invention has two basic steps: (1) constructing a simulation model of a circuit using an object-oriented programming language; and (2) simulating the circuit using the simulation model. It should be obvious to those skilled in the art that the simulation model must be constructed before it can be run, and that, once constructed, it can be run repeatedly without being "reconstructed." Consequently, these steps may be performed jointly or individually.

The notational and structural features of the invention are utilized in the construction phase of the simulation model. According to the notational feature, the process of constructing a simulation model comprises representing hierarchical circuits using an object constructor coding convention that is very similar in appearance to industry standard netlist representations such as EDIF netlist view and structural VHDL. In one embodiment, this involves emulating netlist languages by using constructor parameters that accept boundary signal addresses as port parameters, and by maintaining netlist subcircuit names and netlist connection names even if the same names are used to describe difference subcircuits and connections. Unlike conventional non-netlist models, unique names are not required in the model of the present invention because the model retains its structure during simulation. Structure provides another parameter, aside from a name, by which to identify a connection or subcircuit. According to the structural feature of the invention, the hierarchical properties of the circuit, if any, are represented and maintained by the language's aggregation property. In one embodiment, this process comprises representing the hierarchy of a circuit by containing subcircuit models within circuit models. This may be performed by using model constructor bodies that build subcircuits by constructing interconnected nested signal and model objects. Constructing the hierarchy of model objects may include also performing a run-time audit to ensure model object integrity.

Thus, all of the construction and testing is performed during the construction phase—separate from the actual circuit simulation.

The dataflow and scheduling features are utilized in simulation phase. According to the dataflow feature, the process of simulating a circuit comprises distributing a signal only upon a change in the signal, and then only to those simulation models that use the signal. The signal, therefore, is only distributed to those functions that use it, as opposed to traditional netlist simulation models where signal values are pass up and down the hierarchy during simulation. According to the scheduler feature, the simulation process comprises assigning a priority to a subcircuit model function, and executing the function according to its priority. This ensures that functions are executed in a sequence that maximizes efficiency and reduces redundancy or premature function execution.

A preferred embodiment of the process is depicted as a flow diagram in FIG. 1. Referring to that figure, the process 100 is divided into two domains—construction 110 and simulation 120. The process begins in the construction domain 110. In block 101, the process exercises the notation and structural features of the present invention. In a preferred embodiment, this involves emulating netlist languages by using constructor parameters that accept boundary signal addresses as port parameters, and by maintaining netlist names of subcircuits and connections. Additionally, if the circuit is hierarchical in nature, then subcircuits may be contained within circuits or other subcircuits. Optionally, the construction of the simulation model can be audited in Block 102. Such an audit ensures connectivity and model object integrity. At this point, the simulation model is constructed and ready for simulation.

Simulation is performed in a simulation domain 120. In this domain, Block 103 represents the dataflow feature. This involves distributing a signal only upon a change in that signal, and then only to those subcircuit models having functions that use the signal. Block 104 represents the scheduling feature. Here, those functions that use a distributed signal are scheduled for execution. If there is no change in the signal, or if no model uses the signal, then no subcircuits are scheduled. Block 105 determines if any subcircuit model functions are scheduled for execution. If so, then one or more functions having the highest priority are executed in Block 106, and the process returns to Block 103. If no functions are scheduled according to Block 105, then the process proceeds to Block 107 where an output is provided to the simulator.

Figure 2:
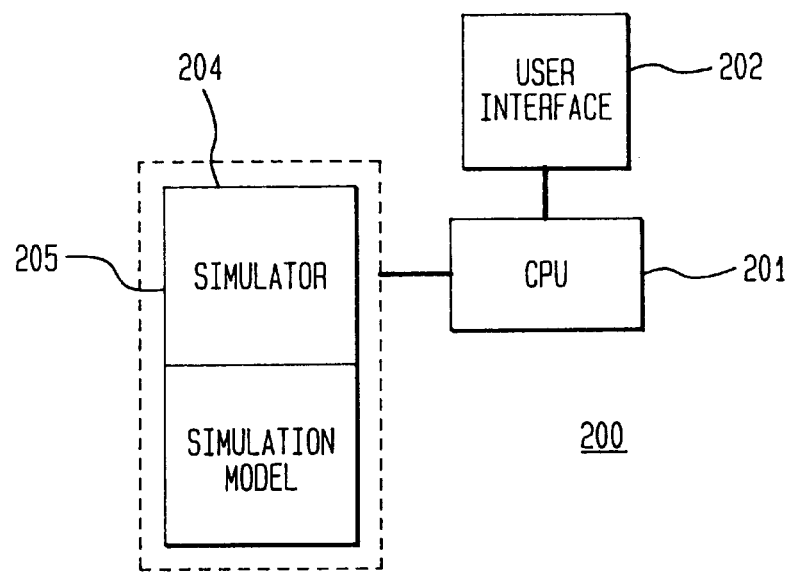
FIG. 2 shows a schematic diagram of a preferred apparatus of the present invention.

Another aspect of the present invention provides for a computer apparatus for simulating the operation of a circuit. An example of such an apparatus is shown in computer system 200 is depicted schematically in FIG. 2. Central to the system 200 is a central processing unit (CPU) 201. The CPU 201 may be a discrete processor, or a combination of processors, configured in a personal computer, controller, work station, main frame or the like. Such CPUs are known in the art.

Operatively connected to the CPU 201 is a user interface 202. The user interface may contain input means, such as a mouse, keyboard, touchscreen, which enables the user to input information into the system 200. It may also include output means, such as a display monitor, printer, which provides the user with an indication of the system's output.

Also operatively connected to the CPU 201 is memory 204 which contains a computer simulator 205 and a simulation model 206. The simulators used by the present invention can be any traditional simulator such as ATTSIM (Lucent Technologies, Allentown, Pa.), Model Technology (Mentor Graphics, Beavertown, Oreg.), VERILOG (Cadence Design Systems, San Jose, Calif.). Interfaced with the simulator 205 is a simulation model 206. The simulation model 206 provides a modular interface, and thus can be "wrapped" to execute under the control of the simulator 205.

The simulation model cooperates with the computer simulator to instruct the processor to perform the process as described above.

Yet another aspect of the present invention is a system of instructional means in an object-oriented programming language for enabling the system 100 to perform the process as described above.

II. Construction

In the construction phase, a simulation model is constructed using the programming convention of the present invention. This Section describes (A) a preferred infrastructure of the simulation model, and (B) a preferred process of constructing the infrastructure.

A. Infrastructure

The simulation model comprises an infra structure of classes that are used to construct objects using methods known in the art. The identification and organization of these classes is an important aspect of the present invention. The classes are divided into basically two groups (1) models and (2) signals.

1. Models

The models of the present invention comprise both generic models and circuit-specific models. The generic models introduce basic parameters and structure, while circuit-specific models are customized for a particular circuit. In this section, a description of a preferred embodiment of the structure and content of general models is provided. Circuit-specific models are described by way of analogy in Section IV. It should be noted that the structure set forth herein is for illustrative purposes and variations will be apparent to someone skilled in the art.

Figure 3:
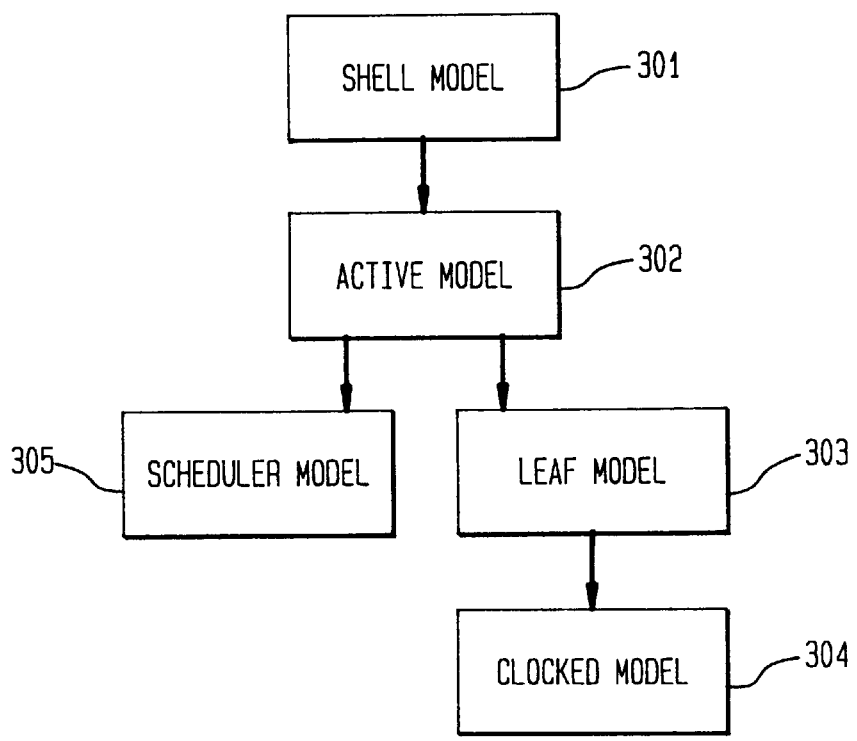
FIG. 3 shows an infrastructure of generic classes of the present invention.

FIG. 3 shows the relationship of one embodiment having five modeling infrastructure classes: (a) a shell model 301, (b) an active model 302, (c) a leaf model 303, (d) a clocked model 304 and (e) a scheduler model 305. Central to the relationships among these models is the concept of inheritance in an object-oriented language such as C++.

For example, C++ defines object contents and behaviors in terms of class definitions, where a class definition states the member objects and member functions (behaviors) found in all objects of that class. Each C++ model type, for example, a leaf model, has its own class definition. In addition, each circuit-specific model type, for example, a circuit-specific leaf model that simulates an arithmetic circuit, has its own class definition. New C++ class definitions use inheritance to inherit default contents and behaviors from previously defined classes. For example, a new class B that inherits from class A provides all of the capabilities of A that B does not override or eliminate. Class B can also redefine some capabilities and add extensions. Class A is known as a "base class" of class B.

The present invention uses inheritance in two ways. First, the hierarchy of building block classes of FIG. 3 define generic model contents and behaviors. Subordinate model classes in this case inherit contents and behaviors from superior model classes. For example, the active model inherits contents and behaviors from the shell model. The second use of inheritance involves defining circuit-specific class definitions that inherit generic modeling contents and behaviors from the generic model classes. A circuit-specific leaf model, for example, is a circuit-specific class derived from a leaf model class that contains a circuit-specific implementation of a subcircuit function along with custom data needed by that function. This circuit-specific leaf model therefore inherits part of its definition from the generic leaf model class, and defines additional parts needed to model its circuit.

Referring back to FIG. 3, arrows point down from base classes to derived classes that inherit modeling behavior. Each generic infrastructure class provides a set of related modeling capabilities that are examined below. Moreover, each class in FIG. 3 except the active model can serve as a base class to circuit-specific model classes. Each of the remaining subsections of this section discusses a specific infrastructure class and the circuit-specific classes that inherit directly from it.

a. Shell model

The shell model serves as the direct base class for structural netlist levels other than the outermost, scheduler level and preserves the hierarchical structure of the simulation model. The hierarchy of all the subcircuit representations is maintained by the shell model using the aggregation and inheritance features of an object-oriented programming language. For example, in a hierarchical circuit structure, one shell model may contain a subcircuit. This shell model is, in turn, contained by a superior shell model. This arrangement continues until the circuit as a whole is contained by a single shell model.

Using object-oriented programming containment techniques that are well known in the art, the shell model acts as a repository for its modeling contents. A circuit-specific shell model class uses its constructor to construct all of the signal and model objects it contains. It contains those objects that appear as nets and subcircuits in its hierarchical netlist. The dependent model passes these parameters to the shell model's constructor. A C++ model object constructor that conforms to the above notational convention creates a C++ model object hierarchy that is isomorphic to a corresponding hierarchical netlist structure such as a structural VHDL model. This simulation model does not discard hierarchical design information present in hierarchical netlist, i.e., it does not flatten the design. Since all of its behavior is the construction-time creation of nested objects, it has no linkage to the dataflow feature and performs no simulation-time actions.

In one embodiment, the shell model has three constructor parameters and stores these constructor parameters in three data fields. The first field, the message handler, is a pointer to an object capable of logging modeling error messages. The shell model saves this pointer so that all derived classes can log construction errors, function errors, and any other errors to a standard place. The shell model's second field is an instance name that is unique within that containing shell model for a circuit-specific model derived from it. The shell model's third field is a pointer to its enclosing shell model. That is, if a particular shell model is contained within an outer shell model, the pointer links the particular shell model to its outer shell model. For the outermost shell model in a modeling hierarchy, this container parameter is a NULL pointer.

The combination of a pointer and an instance name defines a unique lexical binding for a model instance. This preserves the hierarchical relationship among various shells models and, hence, their corresponding subcircuits. The model instance can use a complete hierarchical design path in logging its error messages and other messages.

b. Active model

The active model introduces functions that are common to the models that depend from it. As such, the active model is considered an abstract class and a compiler should disallow construction of an object from it.

In one embodiment, the active model introduces and defines two specific functions, eval() and scheduleForEval(). Eval() is a function that models the circuit's specific behavior of its active model. As defined by the active model, eval() is a pure virtual function and has no body.

Both the leaf model and the scheduler model use eval(). Each circuit-specific leaf model supplies a circuit-specific definition for eval() (simulation function) while the Scheduler model defines its eval() to be the scheduler (scheduling function).

The other function introduced by the active model is a request for scheduling, herein termed "scheduleForEval()." When exercised, this function requests that a particular eval() function be scheduled for execution by the scheduler model. As part of the dataflow feature, the scheduleForEval() function is exercised only upon an input change to the leaf model containing the particular function. Thus, when an input signal of an active model changes value, scheduleForEval() enqueues the active model into the active model's scheduler model.

If one or more scheduler models are contained by another scheduler model, then the contained scheduler model uses the ScheduleForEval() function to schedule its own scheduler function for execution. In the preferred embodiment, the active model takes a pointer to the scheduler model that schedules eval() for this active model. This scheduler parameter is a NULL pointer for an outermost model in a modeling hierarchy. The active model's constructor also takes an integer scheduling priority parameter. Active model saves both of these parameters, and scheduleForEval() gives this priority value to the scheduler when it enqueues its model for eval(). The discussion of scheduler model discusses scheduling priorities.

c. Leaf model

The leaf model represents an elemental component of a circuit and contains a circuit-specific eval() function that simulates the behavior of that particular elemental component. The term "elemental component" as used herein refers to a circuit component that is represented by its behavior rather than by a hierarchy of other components. A leaf model corresponds to a VHDL behavioral model housed within a structural VHDL design.

In a preferred embodiment, there are two basic leaf models. One type represents a combinational circuit. Representation of a combination circuit is relatively simple and typically requires manipulating an input signal when the leaf model's eval() function is exercised. The other type of leaf model represents a more complicated sequential circuit, which may comprise some, possibly empty combinational circuitry, along with storage model objects such as latches. Because such models have the capability of storing one or more input signals, they have an internal state. This type of leaf model stores an input signal(s) at a particular instant and then manipulates the signal(s) when its eval() function is exercised. This latter leaf model requires a clocked model (described below).

In the preferred embodiment, the leaf model adds no new member objects or constructor parameters to those of active model. With certain object-oriented languages, it may be preferable for the Leaf model, as a class, to provide a parameter type to bus signal's evalOnEvent() destination parameter (discussed below).

d. Clocked Model

The clocked model contains a timing function, herein referred to as the "clock()" function, to control the internal state of a leaf model having an internal state. When this function is exercised, the input signal(s) on the leaf model are acknowledged and stored in the leaf model. In this way, the clock() function controls the leaf model's input(s).

Controlling the leaf model's input is preferred in certain situations. For example, there may be situations where the leaf model has one or more input signals that change during the simulation process. These changes, however, are not important and there is no need to run the eval() function for each change. In such situations, a clock() function can be used to control which signals the leaf model accepts and evals. Additionally, such control is particularly useful in multiple input leaf models wherein the eval() function involves more than one value. Eval() functions in this case often require the synchronization of inputs. The clock() function can be used to synchronize the eval function to perform the eval only when all of the input signals are ready for eval.

In the preferred embodiment, the clocked model adds no new member objects or constructor parameters to those of leaf model. Clocked model adds the pure virtual function clock(), making clocked model an abstract class. Each circuit-specific class derived from clocked model should define a clock() function to update the model's internal state upon a clock input change, as well as an eval() function to update bus signal outputs as required for all leaf models.

e. Scheduler Model

The scheduler model supports the scheduling feature. It schedules eval() functions for execution according to their priority. The scheduler model defines eval() to be a scheduler function that calls circuit-specific leaf model/clocked model eval() functions in circuit priority-driven sequence.

Scheduler model is a model infrastructure class representing the outer or root level of a design hierarchy. It generally has circuit-specific descendants. Moreover, the simulation model of the present invention supports the nesting of scheduler models anywhere in a design hierarchy. In a preferred embodiment, when scheduleForEval() schedules a leaf model, it checks to determine whether the leaf model's scheduler model has its own, superior scheduler. If so, and if the contained scheduler model is not already scheduled or running eval(), then the contained scheduler is scheduled in its scheduler's queue, and so on, until either the outermost scheduler model is reached-its scheduler pointer is NULL—or until a scheduler that is already in eval() or queued for eval() is reached. In this way, hierarchical subcircuits can bundle their contents within a scheduler, appearing as a leaf model with respect to scheduling priority.

Scheduler model has several member objects that constitute the scheduling queue. The queue is an extremely efficient priority heap (Aho, Hopcroft and Ullman, *Data Structures and Algorithms*, Section 4.11, "Implementations of Priority Queues," Reading, MA: Addison-Wesley, 1983). Furthermore, in the preferred embodiment, the ScheduleForEval() function that enqueues a leaf or clocked model, the scheduler model's dequeue() operation that removes the leaf or clocked model after its been evaled, and the bus and clock signal dataflow actions (discussed below) are inline C++ functions. Preferably, these functions are short and hand-optimized to assure efficient signal propagation and model evaluation.

A final, critical data object for a scheduler model is an array of priorities containing an entry for each leaf model instance within the scheduler model. A leaf model instance's scheduling priority is its maximum distance from its scheduler model's outputs. Distance is measured as number of intervening leaf models between a leaf model and its scheduler model outputs. The model translation process of FIG. 4 in the form of the model generator program traverses hierarchical netlist and determines scheduling priorities. The search proceeds from each scheduler model output, upstream into nested model outputs and out nested model inputs. The search examines each signal propagation path, assigning the length of the longest acyclic path to a model as its distance. A leaf model with all outputs connected to scheduler model outputs has a priority of 0.

Figure 5:
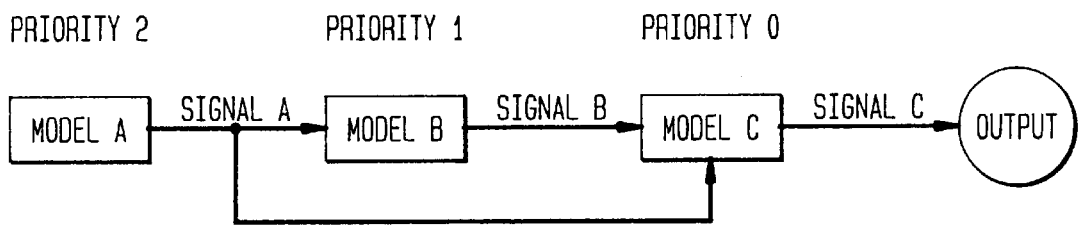
FIG. 5 shows a schematic diagram of an acyclic combinational circuit.

For an acyclic combinational circuit topology the effect is one of scheduling leaf models firings from inputs toward outputs. A signal change that affects more than one leaf model causes subsequent leaf model eval() calls in the optimum order. For example, a change in signal A from model A 501 in FIG. 5 causes model B502 to compute signal B before calling model C503 to compute signal C. If model C's eval() were called before model B's eval(), model B's eval() might change signal B, causing another eval() of model C. For a given set of bus signal value changes in an acyclic combinational circuit, the scheduling priority assures that dependent models do not eval() until all of the contributing models on which they depend, which are known to have higher priorities than the dependent models, have run eval() and changed their downstream dataflow. These source models will not eval() again for this set of bus signal changes because there are no cycles in the signal flow through which they could become scheduled.

Figure 6:
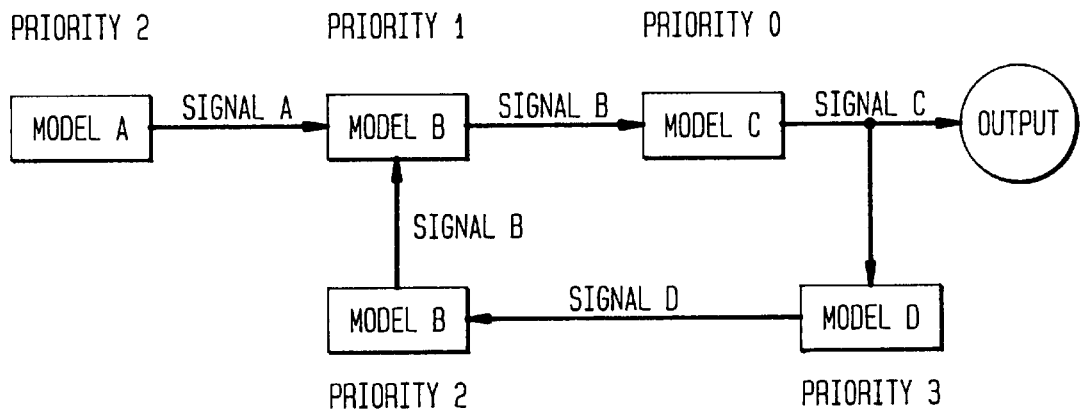
FIG. 6 shows a schematic diagram of an cyclic combinational circuit.

A combinational cycle such as the one in FIG. 6 works correctly for a circuit that settles after a finite amount of cyclic signal change. Models D604 and E605 have higher priorities than models B602 or C603 because the former are further removed from the hierarchical output. Of course it is possible to design a cyclic circuit model that never settles, just as it is possible to design an unstable digital circuit or a digital oscillator. This C++ modeling technology relies on using clock signals driven from outside the bus signal dataflow for generation of digital clocks. Non-oscillating combinational circuit designs translate to stable bus signal dataflow in this modeling technology.

Bus signal connectivity thus determines eval() scheduling priority of leaf models. Each circuit-specific scheduler model C++ class has a class static array that houses leaf priorities for contained leaf model instances. Each leaf model receives its scaler priority as a constructor parameter. Each shell model receives a pointer to the subsection of the scheduler model's priority array that contains the priorities for the leaf models contained within that shell model. In this way each instance of a single shell model gets a unique set of priorities for the unique leaf model instances contained within that shell model instance.

2. Signal Objects

The object-oriented simulation model of the present invention provides two basic signal types that correspond to basic signals of digital circuits. These primary signal classes are (a) bus signal and (b) clock signal.

a. Bus signal

The bus signal object supports the dataflow feature. More specifically, it connects an output of a leaf model that drives it to one or more leaf models that use it as input, and thus serves as a placeholder for a signal value. The bus signal can be of arbitrary width determined at model definition or model construction time. Bus signal can therefore represent a bus or bundle, with a one-bit bus signal representing the case of a one-bit connection. Assorted storage schemes for bus signal are possible. In a preferred embodiment, the bus signal provides signals with per-bit unknown status tags and word-width defined value processing.

In addition to holding one or more bits of digital information, the bus signal also contains a function for prompting the leaf models for which it supplies an input to schedule themselves for eval(). This function is referred to herein as the "EvalonEvent()" function. According to the dataflow feature, the bus signal only prompts leaf models that use its signal as an input to schedule themselves upon a change in value. More specifically, when the value of a bus signal value changes, the bus signal forwards its value to all leaf models using it by scheduling those leaf models for eval(). The bus signal schedules this change with the outer scheduler model immediately.

To sensitize leaf models to bus signal changes, a bus signal's evalOnEvent() function simply saves a pointer to the calling leaf model in a list that the bus signal maintains. The pseudo code below exemplifies the coding convention:

```
busSignal::evalOnEvent(leafModel *destination)
    place destination pointer on this busSignal's list of destinations
    for this signal
```

A bus signal can have more than one variant of a write() function to change its value, but it should have the following signal propagation code that implements the bus signal's contribution to the dataflow feature:

```
busSignal::write(/* write-variant parameters */) {
    if this busSignal value has changed
        for each leafModel on the evalOnEvent list
            call the leafModel's scheduleForEval() function
``` b. Clock signal

The second fundamental signal type is a clock signal, preferably, a one-bit signal. A clock signal sources a leaf model that preferably has at least two member functions, a clock() function to update state internal to the model object, and an eval() function that, like other leaf model eval() functions, updates the model's bus signal outputs. A leaf model that includes clock signals among its connections is called a clocked model, as described above.

Clock signal serves the distinction between a combinational circuit and a sequential circuit. In the preferred embodiment, when a clock signal has an active value transition for a leaf model that it sources, the clock signal calls the leaf model's clock() function immediately. The leaf model's clock() function changes the model's internal state, as stored in latches and or otherwise, based on the model's preceding state and current inputs. The leaf model, however, does not change its bus signal outputs immediately. Rather, the leaf model is scheduled for subsequent eval(). When that eval() runs, the leaf model changes its bus signal outputs, consulting its state that updated at clock() time.

Besides latches and other storage models, any model that transforms a clock signal into another clock signal, for example a clock divider or phase splitter, accepts one or more clock signals as input. The model's clock() function can write derived clock signal outputs immediately; only bus signal outputs defer until eval() time. These clock conditioners are examples of models that might not have bus signals among their connections.

In one embodiment, changing the internal state of the leaf model and scheduling it for eval() are performed by the "clockThenEvalonEvent" function. A clock signal's clockThenEvalOnEvent() function is slightly more complicated and a bus signal's EvalOnEvent() function. The clock signal's clockThenEvalOnEvent() function takes two arguments, a pointer to a clocked model that the signal drives, and a clock transition to which that model is sensitive. Transitions include the values rising, falling, edge and level, which correspond to low-to-high, high-to-low, both low-to-high and high-to-low, or any transition respectively. Level transition includes transitions into and out of unknown clock signal values. The following pseudo code sensitizes clocked models to clock signal changes:

```
clockSignal::clockThenEvalOnEvent(clockedModel *destination,
transition delta) {
    place destination pointer and delta on this clockSignal's list of
    destination-delta
    pairs for this signal
```

A clock signal has the following signal propagation code that implements clock signal's contribution to the dataflow feature:

```
clockSignal::write(/* write-variant parameters */) {
    if this clockSignal value has changed
        for each clockedModel on the list whose delta is sensitive to this
        change
            call the clockedModel's clock( ) function
            call the clockedModel's scheduleForEval( ) function
```

The signal and model infrastructure classes discussed in this section cooperate to provide the mechanism to support the key features of the present invention. Model constructor interfaces that accept boundary signal addresses as port parameters, and model constructor bodies that build subcircuits by constructing interconnected nested signal and model objects, together provide the notational feature. The hierarchical form of the model objects so constructed constitutes the structural feature. Constructors supply the audit feature at construction time, and thus before simulation commences, by checking signal widths and any other dynamic design parameter. Leaf model constructors call input signal functions to sensitize themselves to changes in these signals' values, and changing signals schedule these models at simulation time, thereby providing the dataflow feature. The outer level of a hierarchical design maps to a scheduler model that provides an efficient, and for acyclic or clock-synchronized circuits optimal, scheduling simulation model constituting the scheduling feature.

B. Stages of Model Construction

The construction of the simulation model of the present invention can be performed when initially modeling the circuit, or it can be generated from an existing netlist description of the circuit. Since many circuits are described initially by netlist languages such as VDHL during their design and development phase, converting from netlist to the coding convention of the present invention is particularly preferred.

Figure 4:
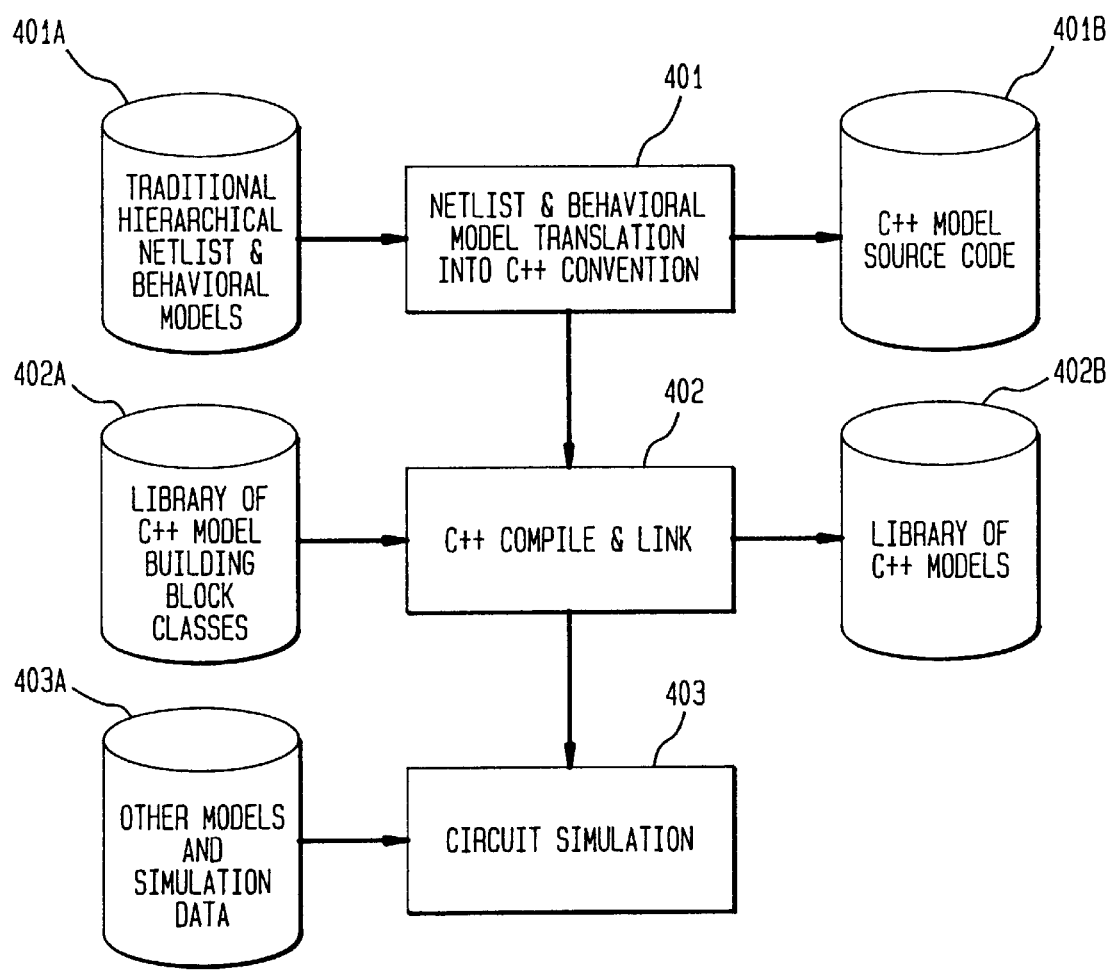
FIG. 4 shows a preferred process for constructing the infrastructure of the simulation model.

FIG. 4 illustrates one possible process of capturing and simulating a C++ model under the proposed simulation model. The process takes as input a traditional description of a hierarchical circuit stored as hierarchical netlist and procedural behavioral models in Database 401A. In Block 401, the process translates netlist and models into corresponding C++ model code, and stores this code in database 401B. In Block 402, the process then compiles this code and links it to C++ model building block class code in a building block library 402A, placing the resulting circuit model in a model library 402B. A vendor simulator or custom simulator retrieves one or more C++ models from the library 402B and uses them in circuit simulations in Block 403. The process represented by Blocks 401, 402 and 403 is considered below in greater detail.

1. Translation (Block 401)

Block 401 translates netlist and behavioral model languages into the C++ convention of the present invention. The information source to this stage in block 401A is hierarchical netlist+behavioral models. For purposes of discussion herein, assume that the former takes the form of VHDL structural information and the latter the form of VHDL behavioral models. The relevant portions of the structural VHDL information are translated into C++ notation using a program called a model generator. Such translators are known in the art and are readily constructed by one skilled in the art. Portions of the hierarchical design that should be omitted from the simulation model can be tagged, and the model generator ignores them. These portions may include design branches that are irrelevant to the modeling needs herein, or low levels of hierarchy that are modeled behaviorally. The model generator also audits the design for faults, inserts C++ objects needed for run-time simulation support, generates drafts of constructor code for hand-coded behavioral models, and generates some auxiliary information for tracking model changes.

Translation of VHDL or C behavioral models into C++ behavioral models under this framework is currently a manual process, although automation of certain behaviors is possible. The C++ signal propagation scheme described here performs only zero-delay combinational and unit-delay sequential circuit simulation. It does not support the finer grain delay modeling available with VHDL, a fact that accounts in part for the faster performance of the C++ models of the present invention. Many VHDL delay features are irrelevant to the application of the models of the present invention which avoid the performance impact of these delay features. Simulation environments that incorporate timing information via timing tables that are external to their models, are able to annotate these models with external timing information. Automatic translation of VHDL behavioral models into C++ behavioral models that draw on the library of building blocks in FIG. 1 is possible. This translation preferably discards VHDL timing annotations in much the same way that VHDL-based circuit synthesis discards these annotations.

2. Compile and Link (Block 402)

The models described in Section IIA may be C++ class definitions and class member function definitions. For each structural and behavioral model, the model generator creates a set of C++ class declarations in a header file. The generator also creates a complete set of function definitions for hierarchical models. No hand coding is necessary for a typical hierarchical model. The generator creates draft implementations of leaf model constructors. Often these constructors are complete and require no hand tuning, although leaf model eval() functions typically are hand-coded.

Two sets of C++ classes reside in the building block library. The first set contains fundamental signal representation types and model infrastructure types as discussed in Section IIA. Signal types provide the basis for signal value storage. They determine range and resolution of signal values. Model infrastructure types support submodel containment and submodel scheduling activities shared by all of these C++ models.

The second set contains reusable helper classes that assist in the hand coding of behavioral models. For example class dynamic-signal, derived from a basic signal storage simulation model, supports unlimited precision fixed-point arithmetic operations. Availability of this class greatly reduces the work involved in writing a behavioral model for a fixed-point arithmetic circuit, especially one whose operands exceed the native word size of the simulation machine. Dynamic-signal is illustrated in Section IV.

The basic infrastructure classes and the helper classes of the library along with the coding convention and the C++ language itself, comprise the target language for model translation. C++ compiling and linking convert C++ model definitions and library classes into a library of C++ circuit models available for linking and dynamic loading into simulation applications.

3. Circuit Simulation (Block 403)

Industry-standard wrappers such as VHDL wrappers accompany the C++ models into the model library. Commercial simulators can link or dynamically load these wrapped models. In a preferred embodiment, a modeling extension environment is provided that uses the Tcl interpreted programming language as an extension language. An extension environment is well known in the art, and refers to the ability to support customization.

An additional level of temporal granularity in C++ models that does not appear in FIG. 4 is the distinction between model construction time and simulation time. Application of model parameters in setting values such as bus widths and memory widths and depths can occur at C++ model definition time or at model link-load time. In the former case, these parameters are hard-coded, possibly by a model generator, into C++ model class definitions. In the latter case, these parameters appear as C++ model constructor parameters. Model constructors configure model objects using these parameters at construction time and perform all run-time audits needed to ensure model integrity, before eval() simulation time. Auditing within the constructor eliminates audit overhead from a model's eval() function. At the time of the first eval() all run-time model configuration and auditing has completed, thereby speeding simulation.

III. Simulation

In the simulation phase of the present invention, the constructed simulation model is run, and in so doing, utilizes the dataflow and scheduling features that speed-up simulation of the circuit.

A key element of both the dataflow feature and the scheduling feature is the fact that only leaf models, the behavioral objects that do the work of simulation, are activated by a scheduler model at simulation time. Intermediate layers of circuit-specific shell models build signal and leaf model object contexts at construction time, but simulation circumvents all shell model layers. The implementation of scheduling functions as short inline functions assures that the main overhead for using this scheduling scheme is the execution of circuit-specific eval() functions. No simulation-time hierarchy of function calls and argument passing is necessary, as it would be with most hand-coded object-oriented or structured-programming implementations. The hierarchy takes the form of shell models that are inactive at simulation time. The models link their input and output signals as data references at construction time, so there is no need to push signal arguments to a run-time stack frame before calling leaf models. Eval() takes no arguments, and circuit-specific eval() runs with the minimum infrastructure overhead at simulation time.

Figure 7:
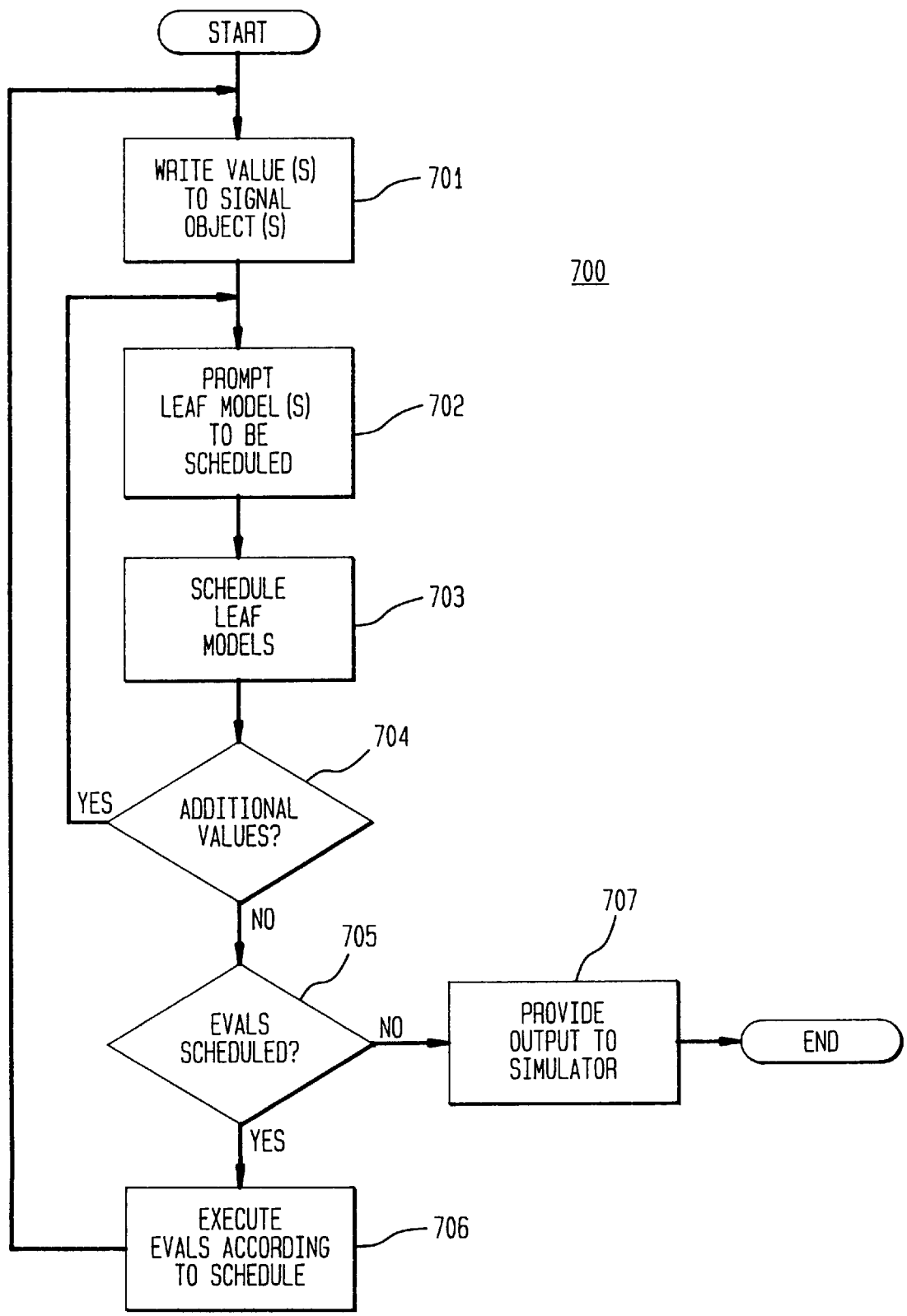
FIG. 7 shows a flow chart of a preferred simulation process of the present invention.

One preferred embodiment for simulating the operation of a circuit using a computer-based simulator is shown in FIG. 7. In Block 701, the at least one value is written to a signal object of the present invention. This value is written initially by the simulator, although as the process reiterates, the value may be written by a model object of the simulation model. Block 702 prompts one or more leaf model objects having an eval() function that receives input from the signal object for scheduling if the value significantly differs from the last value stored in the signal object. In Block 703, one or more leaf model objects of Block 702 are scheduled according to a priority assigned to each leaf model object. In a preferred embodiment, Block 704 determines if other values have been written to other signal objects of the simulation model. If so, then the process of Blocks 702 and 703 is repeated. When all values written to signal objects are considered, then the process proceeds to Block 705. There, a determination is made whether any eval() s have been scheduled. If so, the process moves to Block 706 where one or more eval()s having the highest priority are executed. The output from each of the leaf models which were eval() ed in Block 706 is written to one or more designated signal objects. At this point, the process returns to Block 701 and repeats itself until there are no evals scheduled as determined by Block 705.

In the preferred embodiment, there are two conditions in which no evals are scheduled. First, if a value written to a signal object is not significantly different from the signal object's last value as determined in Block 702, then it is not stored in the signal object, and the one or more model objects to which the signal object provides input are not scheduled for eval(). In the second case, the one or more signal objects to which the one or more model objects write in Block 706 are output signal objects, meaning they are not designated inputs for any leaf models. If no evals are sheduled, then the process proceeds to Block 707 where the output of the simulation model is provided to the simulator.

Optionally, the simulator may convey results of the simulation to a user via user interface means wherein the results are based at least partially on the output value of the simulation model.

Blocks 701 and 702 support the dataflow feature to the simulation of the present invention. Signal values flow at simulation time along dataflow networks previously constructed and audited by model constructors at construction time. The set of all signal dataflow paths is isomorphic to the set of all model connections in an equivalent flattened circuit netlist. Hierarchical models serve to contain and construct nested models and dataflow paths, but hierarchical models do not participate in simulation. Dataflow paths connect only those models at model hierarchy terminuses, i.e., data flow paths connect only the "leaves" of a design hierarchy "tree," and only these leaf models execute eval() at simulation time. The significance of this feature is even though this modeling simulation model retains hierarchy in the form that model objects take, it does not incur the expense of processing hierarchical information at simulation eval() time. Furthermore, each signal dataflow path receives the identities of all leaf models to which it provides input via identification messages from these leaf models' constructors. At simulation time, when and only when a signal value actually changes, the signal schedules for eval() all leaf models on its dataflow path.

Block 704 provides the scheduling feature to the simulation. As discussed in Section II, the outermost level of a circuit hierarchy-the "root" of the netlist "tree" -consists of a model whose eval() function is the scheduler for all leaf models that it contains. In the preferred embodiment, a leaf model enters its scheduler model's scheduling queue when a signal that supplies input to that leaf model changes value. The scheduler uses a priority-based scheduling algorithm, where a leaf model's static priority is its distance from the outputs of the scheduler model. Distance is measured as number of intervening leaf models between a leaf model and scheduler model output. Priority-based scheduling of leaf model eval() execution eliminates redundant calls to leaf model eval() functions for a given set of signal value changes, speeding simulation. Furthermore, the scheduler model uses a priority heap scheduling queue that minimizes time spent scheduling leaf models into the queue and invoking their eval() functions from the queue. In the preferred embodiment, both insertion of a leaf model and extraction of the highest priority leaf model from the queue is based on the function $O(\log(n))$, where n is the number of elements in the queue.

Scheduler model's eval() consults the queue, repeatedly dequeuing the highest priority queued leaf model and calling its eval() until the queue is empty. Eval() of a leaf model may cause the leaf model to change output signal values, causing subsequent leaf models within this scheduler model to be scheduled. The scheduler's eval() does not terminate until all such subsequent leaf models have exited the queue.

Figure 8:
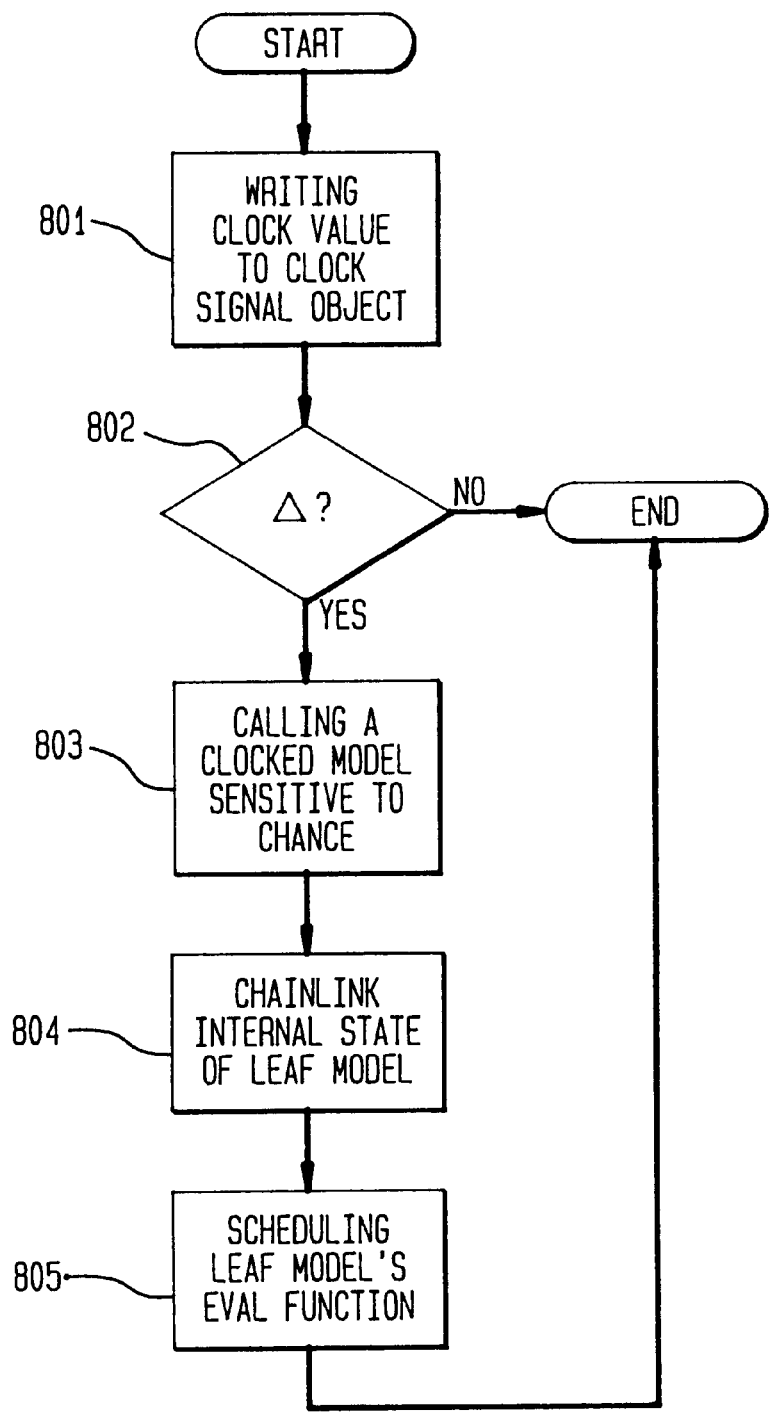
FIG. 8 shows a flow chart of a preferred clocked model sequence.

In embodiments having clocked models, a leaf model object's internal state changes according to the clocked model object before performing the its eval function. A preferred embodiment of changing an leaf model's internal state is depicted in FIG. 8 in a block diagram. Block 801 writes a clock value from the simulator to a clock signal object. In Block 802, the clock value is stored in the clock signal object if the value differs from the clock signal's last value. Block 803 then calls a clocked model object of a leaf model object having a clock function sensitive to a change in the clock value. The internal state of the leaf model object is then changed in Block 804 using the clock function prior to performing the eval function of the leaf model object. Finally, Block 805 calls a scheduler model object via an active model object to schedule the leaf model object's eval function.

Priority calculation of the scheduler model does not consider clock signals. A changing clock signal value triggers immediate calls to clocked model clock() functions, updating clocked model-internal state immediately. The propagation of resulting bus signal changes from clocked model outputs happens as a result of scheduled eval() calls using the priority scheduler.

A clocked model, such as a clock divider, can write a clock value change to a clock signal output from within the clock() function. Only bus signal outputs preferably await eval(). In this way derived clock signals advance through clock signal dataflow immediately on clock value change. A model generator audit checks hierarchical designs to assure acyclic clock signal topology.

When a clock signal changes it calls clock() and scheduleForEval() as already discussed. Boundary bus and clock drivers, typically external to the scheduler model, preferably call the scheduler's eval() after any collection of bus signal changes, and before and after any clock signal change. Bus signal changes can be eval()ed together in combinational logic. Each clock signal change should occur only when all scheduled eval() calls have been executed, in order to present the correct current inputs to latches. Model clock() calls then update clocked model internals, requiring a subsequent eval() call to flush changed clocked model state to outputs.

Note that highly synchronous circuits, where latches update state on a set of common clock transitions and cyclic circuits are mediated by clock transitions, have very low potential for instability under this modeling technology. Higher levels of processor circuit hierarchies have this form, and lower levels, where combinational cycles might appear, are typically implemented as behavioral models.

This completes the generic overview of the construction and simulation aspects of the present invention. Section IV illustrates circuit-specific code that use the infrastructure of the present invention to model a processor circuit.

IV.

In Section A, this example first illustrates the hierarchical design of a simple four-instruction processor in schematic form. Such a simple circuit avoids cluttering the example with an excess of circuit-specific details. It should be noted, however, that the basic modeling approach outlined herein can be applied to circuits having a high degree of complexity as well. For comparison purposes, the example next illustrates a possible structural VHDL implementation of the example circuit in Section B. Finally, in Section C, an implementation using C++ code according to the present invention is provided to demonstrate the key features described above.

A. Example Circuit Schematic Hierarchy

Figure 9:
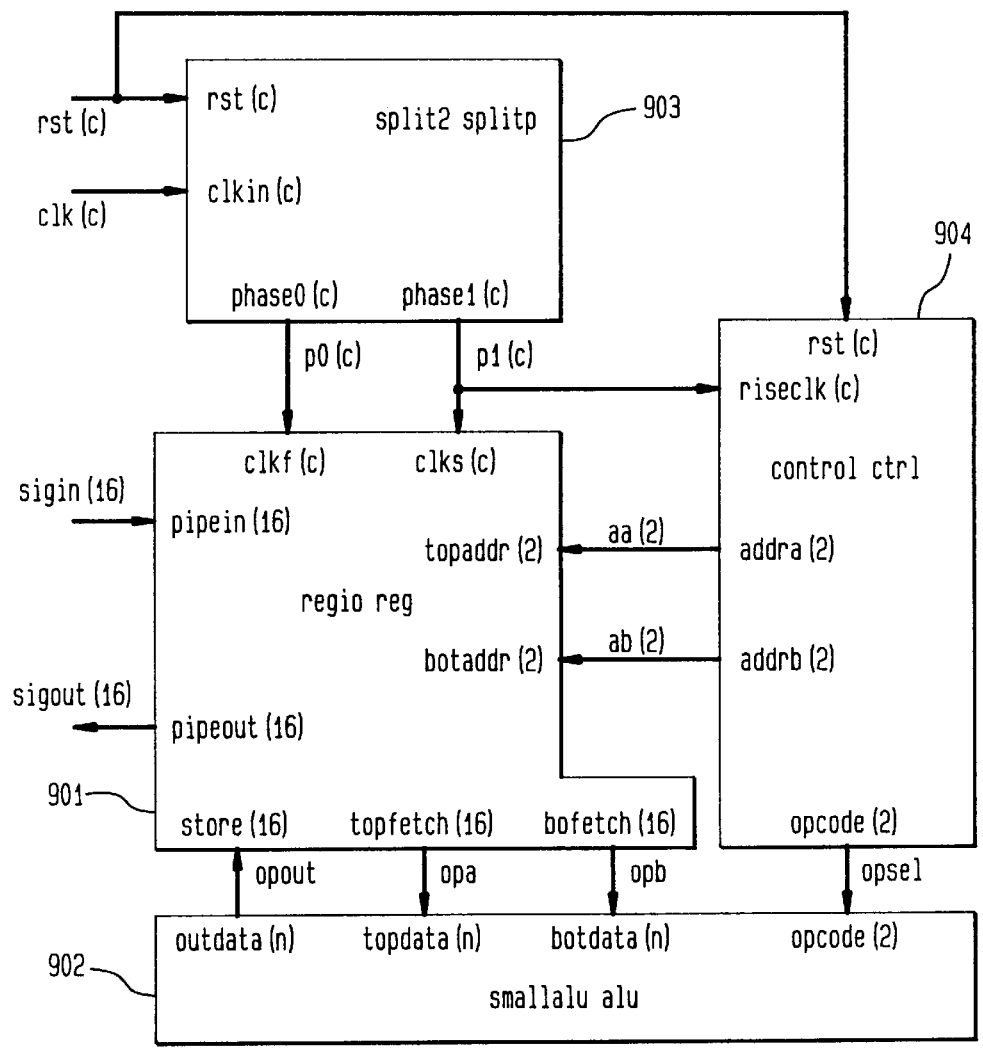
FIG. 9 shows a schematic diagram of a simple processor.

FIG. 9 provides the top level of design hierarchy for a particular circuit 900 named "alupipe." It has four boundary ports: rst, clk, sigin and sigout. At the outermost level alupipe works by reading sigin, transforming its value according to a stored program, and writing output to sigout. Both sigin and sigout are 16-bit bus signals. The parenthesize annotations next to signal and port names give their sizes, where "(n)" denotes a parameterized port size and "(c)" denotes a clock signal. Inputs clk and rst are clock signals that respectively drive and reset the circuit.

Subcircuits in the hierarchy appear as boxes and connecting signals as lines. Each subcircuit has a type name followed by an instance name in bold print. Instance reg 901 sinks input sigin and sources output sigout. In addition to these boundary ports reg 901 houses three 16-bit registers. Each processor instruction can supply one of the three registers from within reg 901 or sigin as a source operand. Most instructions take two source operands. Each processor instruction can store its result into one of the three registers in reg 901 or into sigout.

The smallalu block 902 provides four machine code operations: outdate=topdata+botdata, outdate=topdata−botdata, outdate=topdata<<botdata and outdate=botdata. There are no other processor instructions. The definition of smallalu 902 does not constrain the widths of input and output bus signal operands to a constant. It does constrain them to be an identical size "n." Examination of generated constructor code for smallalu 902 in an upcoming section shows how this constraint is audited at construction time.

Splitp 903 is a phase splitter that copies alternating cycles of clk to outputs phase0 and phase1. Rst provides splitp's initialization at the start of phase0.

Control block ctrl 904 is the only hierarchical subblock in this design, and is depicted in greater detail in FIG. 7. Control houses a 16-bit program counter 1004 and a 6-bits-per-word×16-word read only memory that contains processor instructions. The processor contains no jump instructions, so control simply loops from location 0, initialized into the program counter upon rst assertion, to location 15 and back to 0.

Figure 10:
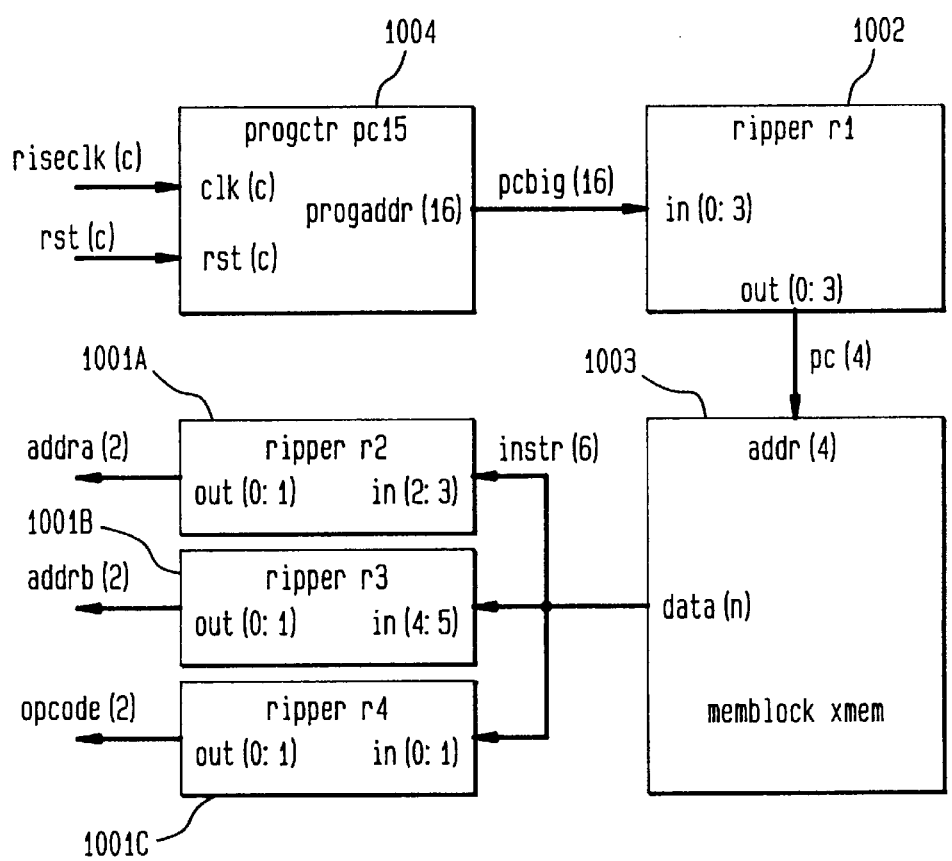
FIG. 10 shows a schematic diagram of a component of the simple processor of FIG. 9.

The ripper instances 1001a, 1001b, and 1001c of FIG. 10 are artifacts of the signal representation technology. A ripper model copies a subset of its input bus signal to an equal-size subset of its output bus signal. Ripper instances take constructor parameters that determine the bit positions of their input and output signals. The C++ model generator automatically inserts rippers for schematic systems that use notational conventions to represent subset and superset connections to buses and bundles.

In FIG. 10, r1 1002 takes the bottom 4 bits of the program counter and feed them to the address input of memory block xmem 1003. Xmem produces a 6-bit instruction from that location at its output, from which rippers r2, r3 and r4 extract operand addresses and an opcode.

Timing for FIGS. 9 and 10 works as follows: Rst is an active-low clock signal that resets the program counter to 0 and resets the phase splitter to the start of phase 0. When rst goes high transitions on clock signal clk drive the circuit.

The rising edge of phase0, which corresponds to the rising edge of every even-numbered clk pulse starting with pulse number 0, causes reg to latch the operand (internal register or sigin) addressed by topaddr into topfetch, and the operand addressed by botaddr into botfetch. The combinational alu operates on these operands using the opcode present on signal opsel, forwarding the result to outdate.

Phase0 clock returns to 0 and then phase 1 has a rising transition. The rising edge of phase 1 causes reg to store the result of the alu operation into the destination register or sigout represented by the same topaddr already used for one of the source operands; the first source operand also specifies destination. The rising edge of phase 1 also advances the program counter inside ctrl.

All boundary signal writing and reading external to alupipe 900 occurs using drivers and monitors of a simulator.

B. VHDL Hierarchy

This section provides one possible VHDL representation of this circuit. The first subsection describes the structural VHDL models, while the second subsection describes only those parts of behavioral models that illustrate the innovations of the modeling technology of the present invention.

1. Structural VHDL

This example uses a plain VHDL integer to represent bus signals. This approach limits expressiveness of signal representation, since unknown bit values and buses that exceed integer bus width cannot be represented. The C++ model that follows the VHDL example uses a signal representation scheme that does not impose these limits. This approach was taken with VHDL simply to make construction and execution of this example fast. The C++ code presented here runs about 11.5 times faster than the VHDL code simulating the same processor using a state-of-the-art VHDL simulator with both running on the same Sun SPARCstation 20 workstation with comparable process load. Replacing the VHDL integer representation of bus signals with bit vector representations capable of expressing unknown bit values and larger than-integer buses would probably slow the VHDL simulation another order of magnitude. The slowing would occur because each integer bus operation in this VHDL model would translate to 16 bit operations with a bit vector representation.

The structural VHDL code for alupipe is provided in code block 1 below:

```
entity alupipe is
    port(sigin: in integer; clk, rst: in bit; sigout: out integer);
end alupipe;
architecture alupipe of alupipe is
```

```
signal p0, p1: bit;
signal aa, ab, opsel, opa, opb, opout: integer;
begin
   reg: regio port map (sigin, aa, ab, p0, opout, p1, sigout, opa, opb);
   splitp: split2 port map (clk, rst, p0, p1);
   alu: smallalu port map (opa, opb, opsel, opout);
   ctrl: control port map (p1, rst, aa, ab, opsel);
end alupipe;
```

The structural VHDL code for control is illustrated in Code Block 2 below:

```
entity control is
   port(riseclk, rst: in bit; addra, addrb, opcode: out integer);
end control;
architecture control of control is
   signal pcbig, pcsmall, instr: integer;
begin
   pc15: progctr port map (riseclk,rst,pcbig);
   r1: ripper generic map (4,0) port map (pcbig, pcsmall);
   r2: ripper generic map (2,2) port map (instr,addra);
   r3: ripper generic map (2,4) port map (instr,addrb);
   r4: ripper generic map (2,0) port map (instr,opcode);
   xmem: mem 16×6 port map (pcsmall,instr);
end control;
```

The ripper model in this code uses VHDL generics to determine ripped bus widths and bit offsets. VHDL generics correspond to C++ constructor parameters beyond the signal port parameters already discussed. C++ model programmers can add such parameters by hand; the translator creates them automatically from schematic annotations.

2. Behavioral VHDL

This section provides only the behavioral VHDL for selected submodels above. In Code Block 3 below, the behavior code for model regio, which is the VHDL equivalent of a clocked model, is illustrated:

```
entity regio is
   port(pipein, topaddr, botaddr: in integer;
      clkf: in bit; store: in integer;
      clks: in bit; pipeout, topfetch, botfetch: out integer);
end regio;
architecture regio of regio is
begin
   process
      type regiostore is array (0 to 2) of integer;
      variable storehouse: regiostore;
   begin
      wait until (((not clkf'stable) and (clkf = '1'))
         or ((not clks'stable) and (clks = '1')));
      if ((not clkf'stable) and (clkf = '1')) then
         if topaddr = integer'left then
            topfetch < = integer'left;
         elsif topaddr = 3 then
            topfetch < = pipein;
         else
            topfetch < = storehouse(topaddr);
         end if;
         if botaddr = integer'left then
            botfetch < = integer'left;
         elsif botaddr = 3 then
            botfetch < = pipein;
         else
            botfetch < = storehouse(botaddr);
         end if;
      else -- clks has risen
         if topaddr = 3 then
            pipeout < = store;
```

```
         elsif topaddr / = integer'left then
            storehouse topaddr) := store;
         end if;
      end if;
   end process;
end regio;
```

The three internal registers reside in variable regiostore. Upon the rising edge of clkf the model inspects topaddr, where value "integer'left" represents an unknown bus signal in this example. When topaddr is unknown output topfetch receives an unknown value, otherwise topfetch receives the register or pipein input addressed by topaddr. Addressing of botfetch's value via botaddr is similar. The rising edge of clks triggers the storage of an operation's result similarly.

The "delta delay" associated with VHDL signal assignments such as the assignment to output port pipeout works comparably to the clock()/eval() delay in C++ clocked models under proposal. (see, J. Bhasker, A VHDL Primer, Revised Edition, Section 4.5, "Signal Assignment Statement," Englewood Cliffs, N.J.: Prentice Hall, 1995) While the assignment to internal state variable storehouse takes effect immediately when it occurs, the signal assignment to pipeout takes effect only after a delta delay, i.e., after all sequential circuits that trigger off of this rising edge of clks have triggered.

Code Block 4 below illustrates the VHDL equivalent of a combinational leaf model for smallalu (again, "integer'left" represents an unknown value):

```
entity smallalu is
   port(topdata, botdata, opcode: in integer; outdata: out integer);
end smallalu;
architecture smallalu of smallalu is
begin
   process(topdata, botdata, opcode)
   begin
      - integer'left is undefined value
      if (botdata = integer'left or opcode = integer'left) then
         outdata < = integer'left;
      elsif opcode = 3 then
         outdata < = botdata;
      elsif topdata = integer'left then
         outdata < = integer'left;
      elsif opcode = 0 then
         outdata < = topdata + botdata;
      elsif opcode = 1 then
         outdata < = topdata - botdata;
      else
         - cannot shift integers, must do it with **
         outdata < = topdata * (2 ** botdata);
      end if;
   end process;
end smallalu:
```

C. Modeling Hierarchy of the Present Invention

The first subsection gives hierarchical models generated from netlist data automatically. The second subsection gives C++ leaf models whose class definitions, constructors and destructors were generated automatically from netlist, and whose eval(), clock() and auxiliary functions were hand coded.

1. Scheduler and Shell Models

Code Block 5 below shows the generated C++ class definition for alupipe_e, where "awmpEncapsulatedPssr" is the actual C++ base class name for scheduler model:

```
#ifndef ALUPIPE_H
#define ALUPIPE_H
#include "awmpsgnl.h"
#include "awmpipsr.h"
#include "alumake.h"
#include "smallalu.h"
    #include "control.h"
    #include "regio.h"
    #include "split2.h"
    class alupipe_e: public awmpEncapsulatedPssr {
    protected:
        const awmpClockSgnl &clk ;/* input */
        const awmpClockSgnl &rst ;/* input */
        const awmpSgnl &sigin ;/* input */
        awmpSgnl &sigout ;/* output */
        awmpSgnl aa, ab, opa, obp, opout, opsel;
        awmpClockSgnl p0, p1;
        smallalu_1 alu; control_s ctrl
        regio_1 reg;
        split2_1 splitp;
        static const int schedulingPriorities[9];
    public:
        alupipe_e(const char *instName,
            awmpShellPssr *lexicalContainer,
            awmpEncapsulatedPssr *schedulingContainer,
            awmpMonDrvTbl *call911, int schedulingPriority,
                awmpClockSgnl &clk /* input */,
            awmpClockSgnl &rst /* input */,
            awmpSgnl &sigin /* input */,
            awmpSgnl &sigout /* output */
        );
        virtual ~alupipe_e( );
    } ;
    #endif /* model header for alupipe */
```

The generator creates necessary #ifdef and #include statements and then proceeds with the class definition. The generator has counted nine leaf models contained within alupipe, accounting for the size of the schedulingPriorities array. In addition to port information, the constructor takes generated instance name, shell model container, scheduling model container and error reporting parameters (instName, lexicalContainer, schedulingcontainer and call911 respectively). Alupipe's scheduling priority is meaningful in cases where an alupipe instance is nested within an enclosing scheduler's design.

This exemplary code displays the notational feature and part of the structural feature of this proposal. There is obviously a one-to-one correspondence between port parameters and internal signal and model objects in the VHDL model of Code Block 1 and the C++ model of Code Block 5. Code Block 5 adds C++ construction-time and simulation-time constructor parameters that are standard, and hence readily generated, in this architecture.

Code Block 6 below shows the generated C++ member function definitions for alupipe:

```
/* file testalu/alupipe.cxx generated by modelgen for model alupipe */
#include "alupipe.h"
alupipe_e::alupipe_e(const char *instName,
    awmpShellPssr *lexicalContainer,
    awmpEncapsulatedPssr *schedulingContainer,
    awmpMonDrvTbl *call911, int schedulingPriority,
    awmpClockSgnl &clk_parm, awmpClockSgnl &rst_parm,
    awmpSgnl &sigin_parm, awmpSgnl &sigout_parm
):
    awmpEncapsulatedPssr(instName,lexicalContainer,schedulingContainer,
        call911,schedulingPriority),
    clk(clk_parm), rst(rst_parm), sigin(sigin_parm), sigout(sigout_parm),
    aa(2,my911), ab(2,my911), opa(16,my911), opb(16,my911),
    opout(16,my911), opsel(2,my911), p0(my911), p1(my911),
    alu("alu",this,this,my911,schedulingPriorities[0],
        opb, opsel, opa, opout),
    ctrl("ctrl",this,this,my911,&(schedulingPriorities[1]),
        p1, rst_parm, aa, ab, opsel),
    reg("reg",this,this,my911,schedulingPriorities[7],
        ab, p0, p1, sigin_parm, opout, aa, opb, sigout_parm, opa),
    splitp("splitp",this,this,my911,schedulingPriorities[8],
        clk_parm, rst_parm, p0, p1)
{
}
alupipe_e::~alupipe_e( ){
}
const int alupipe_e::schedulingPriorities[9] = {
    1 /* [0] alupipe.alu */,
    5 /* [ 1 ] alupipe.ctrl.pc 1 5 */,
    4 /* [2] alupipe.ctrl.r1 */,
    1 /* [3] alupipe.ctrl.r2 */,
    1 /* [4] alupipe.ctrl.r3 */,
    2 /* [5] alupipe.ctrl.r4 */,
    3 /* [6] alupipe.ctrl.xmem */,
    0 /* [7] alupipe.reg */,
    0 /* [8] alupipe.splitp */
};
```

The constructor initializes its underlying scheduler model infrastructure object via the "ampEncapsulatedPssr" constructor call. It initializes a set of member signal references with the addresses of the corresponding boundary ports, in order to keep these addresses available for simulation-time functions. It then constructs signals with their width information and a pointer to the error reporting object, and finally it initializes nested models alu, ctrl, reg and splitp with their standard C++ parameters and their port addresses. Construction of nested signals should occur before construction of nested models, since the latter should register with the former's dataflow feature. The initialization code for alu, ctrl, reg and splitp completes the demonstration of the notational feature and the structural feature for alupipe. The notation and structure of nested model interconnection via constructor parameters is identical to the VHDL model interconnection in Code Block 1.

Class static array schedulingPriorities shows the generated set of priorities and comments for all leaf models contained inside alupipe. Note that alupipe's constructor passes scalar priorities directly to leaf models alu, reg and splitp from schedulingPriorities. Alupipe'constructor passes an address within schedulingPriorities to ctrl because ctrl is a hierarchial shell model that houses six leaf models within its body. Ctrl's constructor parcels these out to nested leaf models as shown below. Ctrl contains no nested shell models, but if it did it would pass a pointer to that model as alupipe passes to ctrl here. This nesting of hierarchical models can occur to arbitrary depth.

Array schedulingPriorities helps demonstrate both the structural feature and scheduling feature of this architecture. Generated comments next to schedulingPriorities' definition shows that the design hierarchy is intact. The priorities themselves, which are distances from alupipe's output ports, show that the hierarchy has effectively been flattened as far as simulation time processing is concerned. Only leaf models enter alupipe's scheduling queue for eval0, and their positions in alupipe's flattened topology give their eval0 priorities.

The generator generates both shell and scheduler definitions for all hierarchical models. Alupipe, for example, could be included as a shell model in a higher order hierarchical design. Code Blocks 7 and 8 below give the C++ definition and implementation of hierarchical block control.

Code Block 7:

```
/* file testalu/control.h generated by modelgen for model control */
    #ifndef CONTROL_H
    #define CONTROL_H
    #include " awmpsgnl.h"
    #include "awmpipsr.h"
    #include "alumake.h"
    #include "progctr.h"
    #include "ripper.h"
    #include "memblock.h"
    class control_s: public awmpShellPssr {
    protected:
       const awmpClockSgnl &riseclk ;/* input */
       const awmpClockSgnl &rst ;/* input */
       awmpSgnl &addrb ;/* output */
       awmpSgnl &addrb ;/* output */
       awmpSgnl &opcode ;/* output */
       awmpSgnl instr, awmpSgnl pc, awmpSgnl pcbig;
       progctr_l pc 15;
       ripper_l r1, r2, r3, r4;
       memblock_l xmem;
       public: static unsigned long * xmemMap;
    public:
       control_s(const char *instName,
          awmpShellPssr *lexicalContainer,
          awmpEncapsulatedPssr *schedulingContainer,
          awmpMonDrvTbl *call911, const int *schedulingPriorities,
       awmpClockSgnl &riseclk /* input */,
       awmpClockSgnl &rst /* input */,
       awmpSgnl &addra /* output */,
       awmpSgnl &addrb /* output */,
       awmpSgnl &opcode /* output */
    );
    virtual ~control_s( );
} ;
#endif /* model header for control */
```

Code Block 8:

```
/* file testalu/control.cxx generated by modelgen for model control */
#include "control.h"
control_s::control_s(const char *instName,
awmpShellPssr *lexicalContainer,
awmpEncapsulatedPssr *schedulingContainer,
awmpMonDrvTbl *call911, const int *schedulingPriorities,
awmpClockSgnl &riseclk_parm, awmpClockSgnl &rst_parm,
awmpSgnl &addra_parm, awmpSgnl &addrb_parm,
awmpSgnl &opcode_parm
):
awmpShellPssr(instName,lexicalContainer,call911),
riseclk(riseclk_parm), rst(rst_parm), addra(addra_parm),
addrb(addrb_parm),
opcode(opcode_parm),
instr(6,my911), pc(4,my911), pcbig(16,my911),
pc15("pc 15",this,schedulingContainer,
   my911,schedulingPriorities[0],
   riseclk_parm, rst_parm, pcbig),
r1("r1",this,schedulingContainer,
   my911,schedulingPriorities[1],
   pcbig, pc, 3, 0, 3, 0 /* ripper generic parameters */
),
r2("r2",this,schedulingContainer,
   my911,schedulingPriorities[2],
   instr, addra_parm, 3, 2, 1, 0),
r3("r3",this,schedulingContainer,
   my911,schedulingPriorities[3],
   instr, addrb_parm, 5, 4, 1, 0),
r4("r4",this,schedulingContainer,
   my911,schedulingPriorities[4],
   instr, opcode_parm, 1, 0, 1, 0),
xmem("xmem",this,schedulingContainer,
   my911,schedulingPriorities[5],
   pc, instr, 16, control_s::xmemMap/* actual parameter */, 6)
{
}
```

```
control s::~control s( ) {
}
```

The constructor of Code Block 7 takes a pointer to an array of schedulingPriorities because control_s is a shell model. It does not define an array of schedulingPriorities because it is not a scheduler model. Instead it receives schedulingPriorities from its enclosing scheduler model, which is alupipe in this example, and which could be another scheduling modeling in another design that uses control as a subcircuit. There is one priority for each nested leaf model, which Code Block 8 passes in leaf model constructor calls. The additional member object "xmemMap" appears because the constructor for the C++ memory block requires a memory configuration parameter, comparable to a VHDL generic, in its construction of xmem. A schematic annotation inside control provides the information needed to generate xmemMap and pass it to xmem. The VHDL example of control could have used a generic for a configurable memory block.

The ripper constructor calls in Code Block 8 show generic parameters, and xmem's constructor call shows generic memory depth of 16 and width of 6 parameters. Schematic annotations support generation of this code.

2. Leaf and Clocked Models

Code Block 9 shows the generated C++ code and Code Block 10 shows the hand code corresponding to the regio VHDL model of Code Block 3. The class definition contains a number of private data members generated from netlist annotations. They are used by the hand-coded clock0 and eval0 functions in directing leaf model signal flow.

Code Block 9:

```
#ifndef REGIO_H
#define REGIO_H
#include "awmpsgnl.h"
#include "awmpipsr.h"
#include "alumake.h"
class regio_l: public awmpClockedPssr {
protected:
   const awmpSgnl &botaddr ;/* input */
   const awmpClockSgnl &clkf ;/* input */
   const awmpClockSgnl &clks ;/* input */
   const awmpSgnl &pipein ;/* input */
   const awmpSgnl &store ;/* input */
   const awmpSgnl &topaddr ;/* input */
   awmpSgnl &botfetch ;/* output */
   awmpSgnl &pipeout ;/* output */
   awmpSgnl &topfetch ;/* output */
   private: awmpSgnl botlatch;
   private: const awmpSgnl * fetchtab[4];
   private: void initFetchTab(void);
   private: awmpSgnl outlatch;
   private: int postfetch;
   private: int postout;
   private: awmpSgnl sig0;
   private: awmpSgnl sig1;
   private: awmpSgnl sig2;
   private: awmpSgnl * storetab[4];
   private: awmpSgnl toplatch;
public:
   regio_l(const char *instName,
      awmpShellPssr *lexicalContainer,
      awmpEncapsulatedPssr *schedulingContainer,
      awmpMonDrvTbl *call911, inst schedulingPriority,
      awmpSgnl &botaddr /* input */,
      awmpClockSgnl &clkf /* input */,
      awmpClockSgnl &clks /* input */,
```

-continued

```
    awmpSgnl &pipein /* input */,
    awmpSgnl &store /* input */,
    awmpSgnl &topaddr /* input */,
    awmpSgnl &botfetch /* output */,
    awmpSgnl &pipeout /* output */,
    awmpSgnl &topfetch /* output */
    );
    virtual ~regio_1( );
    virtual void eval(void);
    virtual void clock(const awmpClockSgnl *source);
};
#endif /* model header for regio */
#include "regio.h"
regio_1::regio_1(
    const char *instName,
    awmpShellPssr *lexicalContainer,
    awmpEncapsulatedPssr *schedulingContainer,
    awmpMonDrvTbl *call911, int schedulingPriority,
    awmpSgnl &botaddr_parm /* input */,
    awmpClockSgnl &clkf_parm /* input */,
    awmpClockSgnl &clks_parm /* input */,
    awmpSgnl &pipein_parm /* input */,
    awmpSgnl &store_parm /* input */,
    awmpSgnl &topaddr_parm /* input */,
    awmpSgnl &botfetch_parm /* output */,
    awmpSgnl &pipeout_parm /* output */,
    awmpSgnl &topfetch_parm /* output */
    ):
    awmpClockedPssr(instName,lexicalContainer,schedulingContainer,
        call911,schedulingPriority),
    botaddr(botaddr_parm) /* input */,
    clkf(clkf_parm) /* input */,
    clks(clks_parm) /* input */,
    pipein(pipein_parm) /* input */,
    store(store_parm) /* input */,
    topaddr(topaddr_parm) /* input */,
    botfetch(botfetch_parm) /* output */,
    pipeout(pipeout_parm) /* output */,
    topfetch(topfetch_parm) /* output */,
    botlatch(16,my911),
    outlatch(16,my911),
    postfetch(0),
    postout (0),
    sig0(16,my911),
    sig1(16,my911),
    sig2(16,my911),
    toplatch(16,my911)
{
    if (botaddr_parm.width( ) !=2) {
        sgnlErrLog("botaddr");
    }
    clkf_parm.ClockThenEvalOnEvent(this,awmpClockSgnl::rise);
    clks_parm.ClockThenEvalOnEvent(this,awmpClockSgnl::rise);
    if (pipein_parm.width ( )!= 16) {
        sgnlErrLog( "pipein");
    }
    if (store_parm.width( ) != 16) {
        sgnlErrLog("store");
    }
    if (topaddr_parm.width( ) != 2) {
        sgnlErrLog("topaddr");
    }
    if (botfetch_parm.width( ) != 16) {
        sgnlErrLog("botfetch");
    }
    if (pipeout_parm.width( ) != 16) {
        sgnlErrLog("pipeout");
    }
    if (topfetch_parm.width( ) != 16) {
        sgnlErrLog("topfetch");
    }
    initFetchTab( );
}
```

The above constructor code shows leaf model participation in the audit feature and dataflow feature. At present only C++ leaf models audit signal widths at construction time. Hierarchical models could also audit signal width, but since all signal propagation occurs at the leaf level, the model generator currently saves some construction time by limiting these audits to leaf models. They are there to assure design integrity, primarily for designs that incorporate leaf model instances through hand coding. The generator audits all constant-width signal constraints at generation time. The auditor cannot audit widths constrained by run-time parameters; these are audited in the above fashion.

The dataflow feature above consists of calls to ClockThenEvalOnEvent for clkf and clks, comparable to the VHDL wait statement of Code Block 3. Rising edges on these clocks trigger regio clock()/eval() calls. Regio is strictly a sequential circuit that performs no action except when clocked, so no EvalOnEvent() calls appear for bus signals such as topaddr. This constructor saves its scheduler feature priority via its call to base class awmpClockedPssr's constructor.

Hand coded function initFetchTab() below initializes a table of operand pointers at construction time. The clock() function logic corresponds to the logic of the VHDL behavioral model of Code Block 3. Private data members postfetch and postout are set in clock() to communicate sequential behavior to eval(). After clock() finishes the scheduler calls eval() according to priority, and eval() completes either a fetch or store, depending on the last clock() action. The write() actions to output ports topfetch, botfetch and pipeout cause their dataflow feature to schedule models to which they provide input.

Code Block 10:

```
regio_1::~regio_1( ) {
}
/* HAND CODED FUNCTIONS:*/
void
regio_1::initFetchTab(void) {
    fetchtab[0] = &sig0;
    fetchtab[1] = &sig 1;
    fetchtab[2] = &sig2;
    fetchtab[3] = &pipein;
    storetab[0] = &sig0;
    storetab[1] = &sig 1;
    storetab[2] = &sig2;
    storetab[3] = &outlatch;
}
void
regio_1::eval(void) {
    if (postfetch) {
        topfetch.write(&toplatch);
        botfetch.write(&botlatch);
        postfetch = 0;
    } else if (postout) {
        pipeout.write(&outlatch);
        postout = 0;
    }
}
void
regio_1::clock(const awmpClockSgnl *source) {
    // fetch clock fetches top & bottom operands
    awmp WORD locaddr;
    if (source = = &clkf) {
        if (topaddr.isUndefined( )) {
            toplatch.setUndefined( );
        } else {
            locaddr = *(topaddr.read( ));
            toplatch.write(fetchtab[locaddr]);
        }
        if (botaddr.isUndefined( )) {
            botlatch.setUndefined( );
        } else {
            locaddr = *(botaddr.read( ));
            botlatch.write(fetchtab[locaddr]);
        }
```

```
    postfetch = 1;
} else {
    awmpSgnl *dest;
    if(topaddr.isBinary( )) {
        dest = storetab[*(topaddr.read( ))];
        dest->write(&store);
        // internal dests don't need flushing, outlatch does
        if (dest = = &outlatch) {
            postout = 1;
        }
    }
  }
}
```

Code Blocks 11 and 12 give the generated and hand code respectively for the other VHDL leaf model examined, smallalu of Code Block 4. Smallalu is a combinational circuit, so the body of class smallalu_1 contains no state variables, and smallalu_1 has an eval() function but no clock() function.

Code Block 11:

```
#ifndef SMALLALU_H
#define SMALLALU_H
#include "awmpsgnl.h"
#include "awmpipsr.h"
#include "alumake.h"
class smallalu_1: public awmpLeafPssr {
protected:
    const awmpSgnl &botdata ;/* input */
    const awmpSgnl &opcode ;/* input */
    const awmpSgnl &topdata ;/* input */
    awmpSgnl &outdata ;/* output */
public:
    smallalu_1(const char *instName,
        awmpShellPssr *lexicalContainer,
        awmpEncapsulatedPssr *schedulingContainer,
        awmpMonDrvTbl *call911, int schedulingPriority,
        awmpSgnl &botdata /* input */,
        awmpSgnl &opcode /* input */,
        awmpSgnl &topdata /* input */,
        awmpSgnl &outdata /* output */
    );
    virtual ~smallalu_1( );
    virtual void eval(void);
};
#endif /* model header for smallalu */
#include "smallalu.h"
smallalu_1::smallalu_1(
    const char *instName,
    awmpShellPssr *lexicalContainer,
    awmpEncapsulatedPssr * schedulingContainer,
    awmpMonDrvTbl *call911, int schedulingPriority,
    awmpSgnl &botdata_parm /* input */,
    awmpSgnl &opcode_parm /* input */,
    awmpSgnl &topdata_parm /* input */,
    awmpSgnl &outdata_parm /* output */
):
    awmpLeafPssr(instName,lexicalContainer,schedulingContainer,
        call911,schedulingPriority),
    botdata(botdata_parm) /* input */,
    opcode(opcode_parm) /* input */,
    topdata(topdata_parm) /* input */,
    outdata(outdata_parm) /* output */
{
    if (botdata_parm.width( ) != outdata.width( )) {
        sgnlErrLog("botdata");
    } else {
        botdata_parm.EvalOnEvent(this);
    }
    if (opcode_parm.width( ) != 2) {
        sgnlErrLog("opcode");
    } else {
        opcode_parm.EvalOnEvent(this);
```

```
    }
    if (topdata_parm.width( )!= outdata.width( )) {
        sgnlErrLog("topdata");
    } else {
        topdata_parm.EvalOnEvent(this);
    }
}
smallalu_1::~smallalu_1( ) {
```

Smallalu's constructor like regio's displays the audit feature. Opcode is constrained to a constant width, but schematic annotations constrain ports topdata, botdata and outdata only to share the same width, resulting in their audits above. The three bus signal ports connect this model into the dataflow feature via EvalOnEvent() calls. This constructor saves its scheduler feature priority via its call to base class awmpLeafPssr's constructor.

Code Block 11:

```
void
smallalu_1::eval(void) {
    awmpWORD operation;
    // don't need topdata to implement rA = rB
    if (opcode.isUndefined( )) {
        outdata. setUndefined( );
        my911->logE(AWMP_BAD_PSSR_OP_CODE);
        return;
    }
    operation = *(opcode.read( ));
    awmpArithSgnl::setMessageHandler(my911);
    //incidental setup for dyna-signal
    awmpDynaSgnl retval(topdata);
    switch(operation) {
        case 0:
            retval += botdata;
            break ;
        case 1:
            retval -= botdata;
            break:
        case 2:
            retval <<= botdata;
            break ;
        case 3:
            retval.copy (botdata);
            break;
    {
    retval.outcopy(outdata);
}
```

The hand code of Code Block 11 corresponds closely to the behavioral VHDL code of Code Block 4. This eval() function uses utility library class awmpDynaSgnl to manipulate the result value as an unlimited precision integer value. The outcopy() operation at the end fits this variable-length signal into the fixed-size outdate port, issuing a warning via the error handler my911 if significant guard bits are discarded. This outcopy triggers downstream dataflow.

COMPARATIVE EXAMPLE

A benchmark simulated processor was tested running applications code using a hierarchical VHDL description running under a state-of-the-art commercial VHDL simulator, and using a custom C++ description running under the proposed simulation model. The proposed simulation model runs one to two orders of magnitude faster than the VHDL simulation; the variability depends upon the degree of resolution of unknown signal value status in the VHDL model, where resolution in the C++ model is at the bit level. The first order of magnitude improvement is due to simulation scheduling strategies discussed in this document, as well as elimination of VHDL features not needed to support the custom application of these models. The second order of magnitude improvement comes from processing signal changes at the bus level (i.e., word level) of resolution instead of at the bit level whenever possible. This word-level processing of signal changes is not part of the proposed simulation model, but it is an example of a non-standard modeling extension readily incorporated into this extensible C++ modeling infrastructure.

What is claimed is:

1. A method for simulating the operation of a circuit in a simulation model using a computer-based simulator, said simulation model having at least one nested subcircuit function and an output, said simulator using said output for generating results on the simulation of the operation of said circuit, said method comprising:

(a) upon a change in an initialized signal in said simulation model, distributing said signal to one or more subcircuit functions that use said signal;

(b) scheduling said subcircuit functions for execution according to a priority assigned to each subcircuit function, wherein the priority of a particular subcircuit function is determined by the number of interceding subcircuit functions between the output of said particular subcircuit function and the output of the simulation model, wherein the highest number is given the highest priority; and (c) executing one or more subcircuit functions with the highest priority to obtain function output, if said function output is the output of said simulation model, then providing the simulator with said function output, otherwise, providing said function output as a signal to one or more subcircuit functions that use said signal and returning to step (b).

2. The method of claim 1, further comprising:

prior to step (a), constructing said simulation model using an object-oriented language wherein a constructor of said subcircuit accepts at least one signal address from a constructor of said simulation model.

3. The method of claim 1, wherein said circuit is hierarchical, and wherein said method further comprises:

prior to step (a), containing at least one subcircuit within another circuit.

4. The method of claim 3, wherein containing at least one subcircuit within another circuit comprises at least:

constructing signal objects and at least one hierarchy of model objects, wherein said hierarchy contains at least one leaf model object; and constructing a function of said leaf model object by associating a signal object with said function.

5. The method of claim 4, wherein constructing said hierarchy of model objects includes performing a run-time audit to ensure model object integrity.

6. The method of claim 1, wherein at least one subcircuit function has an internal state and an associated clock function, said method further comprising:

controlling said subcircuit function's internal state with said clock function.

7. The method of claim 1, further comprising:

providing results of the simulation of the operation of said circuit to a user interface, said results depending at least partially on said output of said simulation model.

8. The method of claim 1, further comprising:

prior to step (a), writing at least one signal from said simulator to said simulation model.

9. A method for simulating the operation of a circuit in a simulation model using a computer-based simulator, said simulation model having an initialized output value, said simulator using the output of said simulation model for generating results on the simulation of the operation of said circuit, said method comprising:

(a) writing at least one value from said simulator to a signal object;

(b) prompting one or more leaf model objects, each having an eval() function that receives input from said signal object, to be scheduled if said value differs from the last value stored in said signal object;

(c) scheduling one or more leaf model objects of step (b) according to a priority assigned to each leaf model object, wherein the priority of a particular leaf model object is determined by the number of interceding each leaf model objects between the particular leaf model object and the output of said simulation model, wherein the highest number is given the highest priority;

(d) providing said output value to said simulator if no leaf model objects are scheduled otherwise, executing the eval() function of one or more leaf models objects having the highest priority according to step (c); to obtain at least one calculated value and writing said value to one or more signal objects designated to receive output from said one or more leaf models and returning to step (b) to repeat the method for said one or more signal objects of step (d).

10. The method of claim 9, further comprising:

determining, prior to step (d), whether another value has been written to a signal object; and repeating steps (b)–(c) for said another value if said another value has been written to a signal object.

11. The method of claim 10, wherein said simulation model comprises at least one scheduler model having a scheduler function, and wherein said scheduler function uses a priority-based scheduling algorithm to assign each leaf model object's priority as a function of its distance from the output of the scheduler model object.

12. The method of claim 9, wherein at least one leaf model object is associated with a clocked model object, said process further comprising:

i. writing a clock value from said simulator to at least one clock signal object;

ii. calling at least one clocked model object having a clock function sensitive to a change in said clock value if said clock value is significantly different from the last clock value in said clock signal object;

iii. changing an internal state of a leaf model associated with said clocked model object of step ii. using said clock function prior to performing the eval function of said leaf model object; and iv. calling a scheduler model object to schedule the eval function of said leaf model of step iii.

13. The method of claim 9, wherein said process further comprises:

prior to step (a), constructing said simulation model using an object-oriented language wherein a constructor of said eval() function accepts at least one signal address from a constructor of the simulation model containing said eval() function.

14. The method of claim 9, wherein said circuit is hierarchical, and wherein said method further comprises:

prior to step (a), containing at least one subcircuit within another circuit.

15. The method of claim 9, wherein, prior to writing to step (a), said method further comprises:

constructing signal objects and a hierarchy of model objects; and constructing an eval function of a leaf model object by storing a pointer in a signal object for a leaf model object having an eval function that uses said signal object.

16. The method of claim 9, further comprising:

providing results of the simulation of the operation of said circuit to a user interface, said results depending at least partially on the output of said simulation model, said output representing the output of said circuit for an input of a value equal to said value of step (a).

17. An apparatus for simulating the operation of a circuit, said apparatus comprising:

a processor;

user interface operatively connected to said processor for receiving input from and conveying output to a user; and memory operatively connected to said processor, said memory containing a simulation model having at least one nested subcircuit function and an output and instructions for enabling said processor to perform the following steps in a simulation of a circuit's operation:

(a) upon a change in an initialized signal in said simulation model, distributing said signal to one or more subcircuit functions that use said signal;

(b) scheduling said subcircuit functions for execution according to a priority assigned to each subcircuit function, wherein the priority of a particular subcircuit function is determined by the number of interceding subcircuit functions between the output of said particular subcircuit function and the output of the simulation model, wherein the highest number is given the highest priority; and (c) executing one or more subcircuit functions with the highest priority to obtain function output, if said function output is the output of said simulation model, then providing the simulator with said function output, otherwise, providing said function output as a signal to one or more subcircuit functions that use said signal and returning to step (b); and (d) providing results of the simulation of the operation of said circuit to a user interface, said results depending at least partially on said output of said simulation model.

18. An apparatus for simulating the operation of a circuit, said apparatus comprising a computer-based simulator having at least:

a simulation model having one or more subcircuit functions and an output; and means for performing at least the following steps:

(a) upon a change in an initialized signal in said simulation model, distributing said signal to one or more subcircuit functions that use said signal;

(b) scheduling said subcircuit functions for execution according to a priority assigned to each subcircuit function, wherein the priority of a particular subcircuit function is determined by the number of interceding subcircuit functions between the output of said particular subcircuit function and the output of the simulation model, wherein the highest number is given the highest priority; and (c) executing one or more subcircuit functions with the highest priority to obtain function output, if said function output is the output of said simulation model, then providing the simulator with said function output, otherwise, providing said function output as a signal to one or more subcircuit functions that use said signal and returning to step (b); and (d) reporting results of the simulation of the operation of said circuit, said results depending at least partially on said output.

19. A method for simulating the operation of a circuit in a simulation model using a computer-based simulator, said simulation model having an initialized output, said simulator using the output of said simulation model for generating results on the simulation of the operation of said circuit, said method comprising:

(a) writing at least one value from said simulator to a signal object in said simulation model;

(b) prompting one or more leaf model objects in said simulation model to be scheduled if said value differs from the last value stored in said signal object, each leaf model object having an eval() function that receives input from said signal object;

(c) scheduling one or more leaf model objects of step (b) according to a priority assigned to each leaf model object, wherein said simulation model comprises at least one scheduler model having a scheduler function, said scheduler function uses a priority based scheduling algorithm to assign each leaf model object's priority as a function of its distance from the output of the scheduler model object, and wherein said scheduler model object comprises a hierarchy of at least two scheduler model objects wherein a subordinate scheduler model object is scheduled as an eval() function in a superior scheduler model object;

(d) determining whether another value has been written to a signal object, and, if so, repeating steps (b)–(c) for said another value, otherwise, proceeding to step (e); and (e) providing the output of said simulation model to said simulator if no leaf model objects are scheduled, otherwise, executing the eval function of one or more leaf models objects having the highest priority according to step (c) to obtain at least one calculated value and writing said calculated value to at least one signal object designated to receive output from said one or more leaf models and returning to step (b) to repeat said process for said signal object.

20. The method of claim 19, further comprising:

providing results of the simulation of the operation of said circuit to a user interface, said results depending at least partially on said output of said simulation model.

21. A method for simulating the operation of a circuit in a simulation model using a computer-based simulator, said simulation model having an initialized output, said simulator using the output of said simulation model for generating results on the simulation of the operation of said circuit, said method comprising:

(a) writing at least one value from said simulator to a signal object in said simulation model, said signal object being a bus signal object, wherein one or more values are written to said bus signal object before said bus signal object calls each leaf model object that uses said bus signal object as input;

(b) prompting one or more leaf model objects in said simulation model to be scheduled if said value differs from the last value stored in said signal object, each leaf model object having an eval() function that receives input from said signal object;

(c) scheduling one or more leaf model objects of step (b) according to a priority assigned to each leaf model object; and (d) providing the output of said simulation model to said simulator if no leaf model objects are scheduled, otherwise, executing the eval function of one or more leaf models objects having the highest priority according to step (c) to obtain at least one calculated value and writing said calculated value to at least one signal object designated to receive output from said one or more leaf models and returning to step (b) to repeat said process for said signal object.

22. The method of claim 21, further comprising:

providing results of the simulation of the operation of said circuit to a user interface, said results depending at least partially on said output of said simulation model.

23. The method of claim 1, wherein said results are used to debug application code running on a simulated processor.

24. The method of claim 1, wherein said signal is distributed to only those subcircuit functions that use said signal.

* * * * *